United States Patent
Tsuji et al.

(10) Patent No.: US 11,917,899 B2
(45) Date of Patent: Feb. 27, 2024

(54) ARYLAMINE-FLUORENE ALTERNATING COPOLYMER, ELECTROLUMINESCENCE DEVICE MATERIAL, AND ELECTROLUMINESCENCE DEVICE USING THE POLYMER

(71) Applicant: SAMSUNG ELECTRONICS CO., LTD., Suwon-si (KR)

(72) Inventors: Masashi Tsuji, Hwaseong-si (KR); Takahiro Fujiyama, Yokohama (JP); Yusaku Konishi, Yokohama (JP); Dae Young Chung, Suwon-si (KR); Fumiaki Kato, Yokohama (JP); Jaejun Chang, Gwacheon-si (KR); Keigo Furuta, Yokohama (JP); Takao Motoyama, Hwaseong-si (KR); Eun Joo Jang, Suwon-si (KR); Hyo Sook Jang, Suwon-si (KR); Tae Ho Kim, Seongnam-si (KR); Tomoyuki Kikuchi, Hwaseong-si (KR); Yuho Won, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 424 days.

(21) Appl. No.: 17/193,078

(22) Filed: Mar. 5, 2021

(65) Prior Publication Data
US 2021/0288258 A1    Sep. 16, 2021

(30) Foreign Application Priority Data

Mar. 5, 2020  (JP) .................................. 2020-038096
Feb. 26, 2021 (KR) ........................ 10-2021-0026330

(51) Int. Cl.
  $H10K\ 85/10$    (2023.01)
  $C09K\ 11/06$    (2006.01)
  (Continued)

(52) U.S. Cl.
  CPC ........... $H10K\ 85/115$ (2023.02); $C08G\ 61/12$ (2013.01); $C09K\ 11/06$ (2013.01); $H10K\ 85/151$ (2023.02);
  (Continued)

(58) Field of Classification Search
  CPC . H01L 51/115; H01L 51/151; H01L 51/0043; H01L 51/502; H01L 51/5056;
  (Continued)

(56) References Cited

U.S. PATENT DOCUMENTS 8,330,142 B2  12/2012  Cho et al.
8,440,325 B2   5/2013  McKiernan et al.
(Continued)

FOREIGN PATENT DOCUMENTS

EP    03321341 A1   5/2018
JP    2009521118 A  5/2009
(Continued)

OTHER PUBLICATIONS

Chen et al. ,Journal of Polymer Science: Part A: Polymer Chemistry, vol. 48, 4654-4667 (2010).*
Liao et al. ,Chem. Mater. 2007, 19, 6350-6357.*

*Primary Examiner* — Shane Fang
(74) *Attorney, Agent, or Firm* — CANTOR COLBURN LLP

(57) ABSTRACT

An arylamine-fluorene alternating copolymer having a structural unit (A) is represented by Chemical Formula (1):
(Continued)

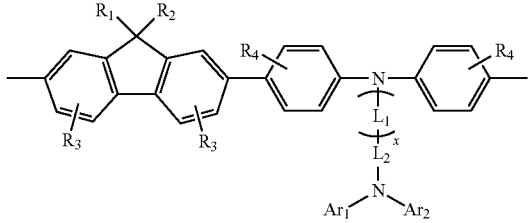

(1)

wherein Chemical Formula (1) is the same as described in the detailed description.

9 Claims, 1 Drawing Sheet

(51) Int. Cl.
*C08G 61/12* (2006.01)
*H10K 50/15* (2023.01)
*H10K 50/17* (2023.01)

(52) U.S. Cl.
CPC . *C08G 2261/124* (2013.01); *C08G 2261/147* (2013.01); *C08G 2261/148* (2013.01); *C08G 2261/1412* (2013.01); *C08G 2261/18* (2013.01); *C08G 2261/228* (2013.01); *C08G 2261/312* (2013.01); *C08G 2261/3142* (2013.01); *C08G 2261/3162* (2013.01); *C08G 2261/95* (2013.01); *C09K 2211/1416* (2013.01); *C09K 2211/1425* (2013.01); *C09K 2211/1433* (2013.01); *H10K 50/15* (2023.02); *H10K 50/17* (2023.02)

(58) Field of Classification Search
CPC ............. H01L 51/5072; H01L 51/0072; H01L 51/5012; H10K 50/17; H10K 50/15; C08G 61/12; C08G 2261/124; C08G 2261/1412; C08G 2261/147; C08G 2261/148; C08G 2261/18; C08G 2261/228; C08G 2261/312; C08G 2261/3142; C08G 2261/3162; C08G 2261/95; C08G 2261/1416; C08G 2261/1425; C08G 2261/1433; C09K 11/06; C07D 403/04; C07D 403/10
See application file for complete search history.

(56) References Cited

U.S. PATENT DOCUMENTS

| | | |
|---|---|---|
| 8,580,393 B2 | 11/2013 | Mizuki et al. |
| 9,595,679 B2 | 3/2017 | Huh et al. |
| 9,882,142 B2 | 1/2018 | Mujica-Fernaud et al. |
| 10,243,148 B2 | 3/2019 | Kato et al. |
| 10,355,219 B2 | 7/2019 | Shitagaki et al. |
| 10,396,287 B2 | 8/2019 | Pillow et al. |
| 10,580,992 B2 | 3/2020 | Pegington et al. |
| 2011/0017983 A1 | 1/2011 | Mizuki et al. |
| 2018/0097178 A1 | 4/2018 | Mujica-Fernaud et al. |

FOREIGN PATENT DOCUMENTS

| | | |
|---|---|---|
| JP | 2010199067 A | 9/2010 |
| JP | 2015127375 A | 7/2015 |
| JP | 6129207 B2 | 5/2017 |
| JP | 6442977 B2 | 12/2018 |
| JP | 6447936 B2 | 1/2019 |
| JP | 6454226 B2 | 1/2019 |
| JP | 6520881 B2 | 5/2019 |
| JP | 2019112407 A | 7/2019 |
| WO | 2009110360 A1 | 9/2009 |
| WO | 2017146083 A1 | 8/2017 |

* cited by examiner

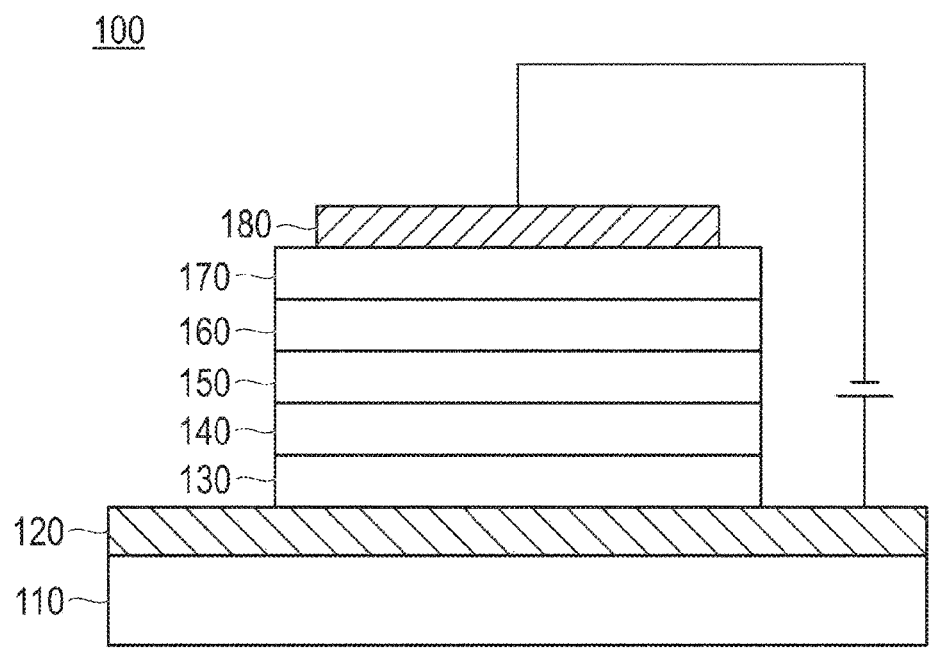

ARYLAMINE-FLUORENE ALTERNATING COPOLYMER, ELECTROLUMINESCENCE DEVICE MATERIAL, AND ELECTROLUMINESCENCE DEVICE USING THE POLYMER

CROSS-REFERENCE TO RELATED APPLICATION

This application claims priority to and the benefit of Japanese Patent Application No. 2020-038096 filed in the Japan Patent Office on Mar. 5, 2020 and Korean Patent Application No. 10-2021-0026330, filed in the Korean Patent Office on Feb. 26, 2021, the entire contents of which are incorporated herein by reference.

BACKGROUND

1. Field

The present disclosure relates to an arylamine-fluorene alternating copolymer, and an electroluminescence device material and an electroluminescence device using the same.

2. Description of the Related Art

Research and development of electroluminescence devices (EL devices) are actively progressing. In particular, EL devices are expected to be used as solid-light-emitting type devices that may be manufactured inexpensively and used in large area full color display devices or recording light source arrays. An EL device is a light-emitting device including a thin film of several nanometers to several hundred nanometers between an anode and a cathode. In addition, the EL devices usually further include a hole transport layer, a light-emitting layer, an electron transport layer, and the like.

Among these, the light-emitting layer includes a fluorescent light-emitting material and a phosphorescent light-emitting material. The phosphorescent light-emitting material is a material which is expected to have luminous efficiency of about four times that of the fluorescent light-emitting material. In addition, since it covers a wide color gamut, a RGB light source requires an emission spectrum having a narrow half value width. Particularly, although deep blue is particularly required for blue, there are currently no devices found to have a long-span and color purity.

As a method of solving such a problem, there is a light-emitting device using a "quantum dot" which is an inorganic light-emitting material (Japanese Patent Laid-Open Publication No. 2010-199067). Quantum dots (QD) are semiconductor materials having crystal structures of several nanometers in size and are made up of hundreds to thousands of atoms. Because quantum dots are very small in size, a surface area per unit volume is large. For this reason, most of the atoms are present on the surface of the nanocrystals, and exhibit quantum confinement effects. Due to the quantum confinement effect, a quantum dot is able to adjust the emission wavelength by adjusting its size, and has been the focus of a lot of attention because it has characteristics such as improved color purity and high photoluminescence (PL) luminous efficiency. A quantum dot electroluminescence device (QD LED) is a three-layered device including a hole transport layer (HTL) and an electron transport layer (ETL) at both ends with a quantum dot light-emitting layer which is known as the basic device.

SUMMARY

However, in the electroluminescence device (particularly quantum dot electroluminescence device) using the hole transport material described in Japanese Patent Laid-Open Publication No. 2010-199067, sufficient durability (especially luminescence life-span) could not be achieved.

Accordingly, the present invention has been made in view of the above circumstances and is to provide a technology capable of improving durability (particularly luminescence life-span) of an electroluminescence device (even a partially quantum dot electroluminescence device).

That is, the inventors hereof have discovered that the above-described and other deficiencies of the art are met by an arylamine-fluorene alternating copolymer having a structural unit (A) represented by Chemical Formula (1).

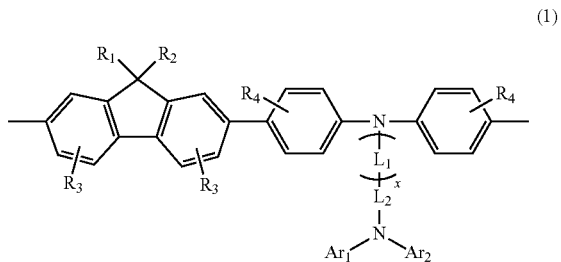

In Chemical Formula (1), $R_1$ to $R_4$ each independently represent a hydrogen atom or a hydrocarbon group having 1 to 16 carbon atoms, $L_1$ represents a substituted or unsubstituted aromatic hydrocarbon group having 6 to 25 carbon atoms or a substituted or unsubstituted divalent aromatic heterocyclic group, x is 0, 1, or 2 and when x is 2, each occurrence of $L_1$ may be the same or different, respectively, $L_2$ represents a substituted or unsubstituted aromatic hydrocarbon group having 6 to 25 carbon atoms or a substituted or unsubstituted divalent aromatic heterocyclic group, wherein $L_2$ may form a ring with $Ar_1$, $Ar_1$ represents a substituted or unsubstituted aromatic hydrocarbon group having 6 to 25 carbon atoms, or a substituted or unsubstituted divalent aromatic heterocyclic group, and forms a ring with $Ar_2$ or $L_2$, and $Ar_2$ represents an aromatic hydrocarbon group or an aromatic heterocyclic group having 6 to 25 carbon atoms wherein the aromatic hydrocarbon group or the aromatic heterocyclic group is substituted with a linear hydrocarbon group having 1 to 12 carbon atoms or a branched hydrocarbon group having 1 to 12 carbon atoms, wherein $Ar_2$ optionally forms a ring with $Ar_1$.

BRIEF DESCRIPTION OF THE DRAWINGS

FIG. 1 is a schematic view showing an organic electroluminescence device according to an exemplary embodiment.

DETAILED DESCRIPTION

In a first embodiment, the present disclosure provides an arylamine-fluorene alternating copolymer including a structural unit (A) represented by Chemical Formula (1):

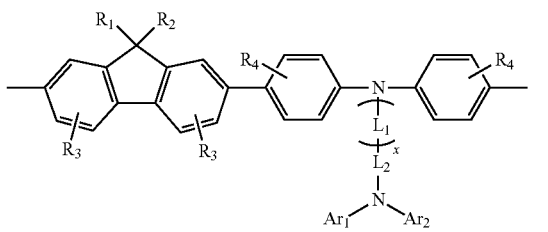

(1)

In Chemical Formula (1), $R_1$ to $R_4$ each independently represent a hydrogen atom or a hydrocarbon group having 1 to 16 carbon atoms, $L_1$ represents a substituted or unsubstituted aromatic hydrocarbon group having 6 to 25 carbon atoms or a substituted or unsubstituted divalent aromatic heterocyclic group, x is 0, 1, or 2 and when x is 2, each occurrence of $L_1$ may be the same or different, respectively, $L_2$ represents a substituted or unsubstituted aromatic hydrocarbon group having 6 to 25 carbon atoms, or a substituted or unsubstituted divalent aromatic heterocyclic group, wherein $L_2$ may form a ring with $Ar_1$, $Ar_1$ represents a substituted or unsubstituted aromatic hydrocarbon group having 6 to 25 carbon atoms, or a substituted or unsubstituted divalent aromatic heterocyclic group, and forms a ring with $Ar_2$ or $L_2$, and $Ar_2$ represents an aromatic hydrocarbon group or an aromatic heterocyclic group having 6 to 25 carbon atoms wherein the aromatic hydrocarbon group or the aromatic heterocyclic group is substituted with a linear hydrocarbon group having 1 to 12 carbon atoms or a branched hydrocarbon group having 1 to 12 carbon atoms, wherein $Ar_2$ may form a ring with $Ar_1$. In the present specification, the structural unit (A) represented by Chemical Formula (1) may also be simply referred to as a "structural unit (A)" or a "structural unit (A) according to the present disclosure."

In addition, an arylamine-fluorene alternating copolymer having a structural unit (A) represented by Chemical Formula (1) is simply referred to as an "arylamine-fluorene alternating copolymer," an "arylamine-fluorene alternating copolymer according to the present disclosure," or an "alternating copolymer according to the present disclosure."

In a second embodiment, the present disclosure provides an electroluminescence device material including the arylamine-fluorene alternating copolymer of the present disclosure.

In a third embodiment, the present disclosure provides an electroluminescence device including a first electrode and a second electrode, and at least one organic film disposed between the first electrode and the second electrode, wherein at least one of the organic films includes the arylamine-fluorene alternating copolymer of the present disclosure. In this specification, the electroluminescence device is also referred to simply as "LED."

The quantum dot electroluminescence device is also referred to simply as "QLED."

An organic electroluminescence device is also called simply "OLED."

As a material constituting the light-emitting layer or the carrier transport layer of the electroluminescence device, various low molecular materials or polymer materials may be used. Among these, the low molecular materials are good in terms of efficiency and life-span of the device. However, in the case of using a low molecular weight material, there is a problem that the manufacturing cost is high because it is necessary to manufacture a device in a vacuum process. On the other hand, TFB etc. are known as a hole transport materials or as polymer materials (for example, paragraph [0037] of Japanese Patent Laid-Open Publication No. 2010-199067). However, with such a polymer material, sufficiently long durability (luminescence life-span) may not be achievable (see Comparative Example 1). For this reason, there is a need in the art for a polymer material capable of improving durability (luminescence life-span) is. The inventors have discovered that by applying the alternating copolymer having the structural unit (A) of Chemical Formula (1) to the electroluminescence device, luminescence life-span may be improved compared with the case of using a known material. In addition, by applying the alternating copolymer having the structural unit (A) of Chemical Formula (1) to an electroluminescence device, sufficient luminous efficiency may be achieved while maintaining a certain low driving voltage. In the structural unit (A) of Chemical Formula (1), a hydrocarbon group is present in the side chain ($Ar_2$). Without wishing to be bound by theory, it is believed that in a quantum dot electroluminescence device having a hole transport layer including the arylamine-fluorene alternating copolymer and a light-emitting layer including a quantum dot, since the hydrocarbon group of the side chain of the arylamine-fluorene alternating copolymer in the hole transport layer may exist closer to the quantum dot included in the light-emitting layer, the hydrocarbon group of the side chain of the arylamine-fluorene alternating copolymer interacts closely with the quantum dot. Accordingly, holes may be efficiently injected into the quantum dot (i.e., hole injection properties are high), and durability (luminescence life-span) may be improved.

In addition, in the structural unit (A) of Chemical Formula (1), a nitrogen atom blocks the conjugation of the main chain. Thereby, a triplet energy level of the arylamine-fluorene alternating copolymer is increased, the hole mobility (bulk nobility) due to the main chain is high, and high current efficiency may be achieved. Therefore, excellent luminous efficiency may be achieved by the polymer compound (main chain) having the structural unit (A). In addition, in the structural unit (A) of Chemical Formula (1), the main chain is separated with a nitrogen atom. For this reason, the arylamine-fluorene alternating copolymer of the present disclosure exhibits properties of a low-molecular weight compound having a similar energy level to that of a quantum dot even when polymerized. For this reason, by using the arylamine-fluorene alternating copolymer of the present disclosure, an increase in the driving voltage may be suppressed and a low driving voltage may be achieved.

Therefore, an electroluminescence device (especially a quantum dot electroluminescence device) using an alternating copolymer having the structural unit (A) of Chemical Formula (1) may exhibit high durability (luminescence life-span) and sufficient luminous efficiency may be achieved under the low driving voltage.

In addition, since the arylamine-fluorene alternating copolymer of the present disclosure has improved film formability and solvent solubility, it is possible to form a film by a wet (coating) method. Therefore, by using the arylamine-fluorene alternating copolymer of the present disclosure, an area of the electroluminescence device may be improved, and high productivity may be realized. The above effects may be effectively exerted when the arylamine-fluorene alternating copolymer of the present disclosure is applied to a hole transport layer or a hole injection layer of an EL device, particularly a QLED.

Hereinafter, embodiments of the present disclosure are described. The present disclosure is not limited only to the following embodiments. In addition, each drawing is exaggerated for better understanding and ease of description, and a dimensional ratio of each constituent element in each drawing may be different from the actual one. In addition, when the embodiment of the present disclosure has been described with reference to the drawings, the same reference numerals are given to the same elements in the description of the drawings, and redundant descriptions are omitted.

It will be understood that when an element is referred to as being "on" another element, it can be directly on the other element or intervening elements may be present therebetween In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures It will be understood that relative terms are Cintended to encompass different orientations of the device in addition to the orientation depicted in the Figures For example, if the device in one of the figures is turned over, elements described as being on the "lower" side of other elements would then be oriented on "upper" sides of the other elements The exemplary term "lower," can therefore, encompasses both an orientation of "lower" and "upper," depending on the particular orientation of the FIGURE Similarly, if the device in one of the figures is turned over, elements described as "below" or "beneath" other elements would then be oriented "above" the other elements The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments As such, variations from the shapes of the illustrations as a result, for example, of manufacturing techniques and/or tolerances, are to be expected Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features Moreover, sharp angles that are illustrated may be rounded Thus, the regions illustrated in the figures are schematic in nature and their shapes are not intended to illustrate the precise shape of a region and are not intended to limit the scope of the present claims.

As used herein, unless specifically stated, operations and measurement of properties are carried out under conditions of room temperature (greater than or equal to about 20° C. and less than or equal to about 25° C.)/relative humidity of greater than or equal to about 40% RH and less than or equal to about 50% RH.

[Arylamine-Fluorene Alternating Copolymer]

The arylamine-fluorene alternating copolymer of the present disclosure includes a structural unit (A) represented by Chemical Formula (1). The arylamine-fluorene alternating copolymer having such a structural unit (A) has a high hole injection property for a quantum dot, and may improve durability (luminescence life-span). Further, high current efficiency and low driving voltage may be achieved. The arylamine-fluorene alternating copolymer of the present disclosure may include one type of structural unit (A), or two or more types of structural units (A).

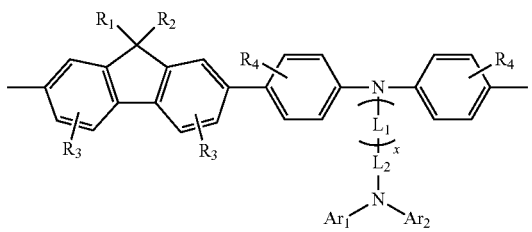

(1)

In Chemical Formula (1), $R_1$ to $R_4$ each independently represent a hydrogen atom or a hydrocarbon group having 1 to 16 carbon atoms. Herein, $R_1$ to $R_4$ may be the same or different. Desirably, $R_1$ and $R_2$ may be the same. Further, in Chemical Formula (1), two $R_3$ groups may be the same or different, but may be desirably the same. Likewise, in Chemical Formula (1), two $R_4$ groups may be the same or different, but may be desirably the same.

The hydrocarbon group having 1 to 16 carbon atoms as $R_1$ to $R_4$ is not particularly limited, and examples thereof include a linear or branched alkyl group, an alkenyl group, an alkynyl group, and a cycloalkyl group. On the other hand, when $R_1$ to $R_4$ is an alkenyl group or an alkynyl group, the carbon number of $R_1$ to $R_4$ is greater than or equal to 2 and less than or equal to 16. Likewise, when $R_1$ is a cycloalkyl group, the number of carbon atoms of $R_1$ to $R_4$ is greater than or equal to 3 and less than or equal to 16.

Examples of the alkyl group having 1 to 16 carbon atoms may include a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropylpropyl group, a 1,2-dimethyl butyl group, an n-heptyl group, a 1,4-dimethylpentyl group, a 3-ethylpentyl group, a 2-methyl-1-isopropylpropyl group, a 1-ethyl-3-methyl butyl group, an n-octyl group, a 2-ethylhexyl group, a 3-methyl-1-isopropylbutyl group, a 2-methyl-1-isopropyl group, a 1-tert-butyl-2-methylpropyl group, an n-nonyl group, a 3,5,5-trimethyl hexyl group, an n-decyl group, an isodecyl group, an n-undecyl group, a 1-methyldecyl group, an n-dodecyl group, an n-tridecyl group, an n-tetradecyl group, an n-pentadecyl group, an n-hexadecyl group, and the like.

Examples of the alkenyl group having 2 to 16 carbon atoms may include a vinyl group, an allyl group, a 1-propenyl group, a 2-butenyl group, a 1,3-butadienyl group, a 2-pentenyl group, an isopropenyl group, and the like.

Examples of the alkynyl group having 2 to 16 carbon atoms may include an ethynyl group and a propargyl group.

Examples of the cycloalkyl group having 3 to 16 carbon atoms may include a cyclopropyl group, a cyclobutyl group, a cyclopentyl group, and a cyclohexyl group.

Among these, from the viewpoint of a higher hole injection property, a higher triplet energy level, a lower driving voltage, and a film forming property, and the balance of any two or more of them (especially the balance between hole injection property and film forming property), each occurrence of $R_1$ and $R_2$ may desirably be a linear alkyl group having 4 to 15 carbon atoms or a branched alkyl group alkyl group having 4 to 15 carbon atoms, more desirably, a linear alkyl group having 5 to 12 carbon atoms or a branched alkyl group alkyl group having 5 to 12 carbon atoms, and even more desirably a linear alkyl group having 6 to 10 carbon atoms or a branched alkyl group alkyl group having 6 to 10 carbon atoms. Further, from the viewpoint of higher hole injection property, higher triplet energy level, lower driving voltage, and film forming property, and the balance of any two or more of them (especially the balance between hole injection property and film forming property), each occurrence of $R_3$ and $R_4$ may independently be a hydrogen atom (unsubstituted) or a linear alkyl group having 1 to 8 carbon atoms or a branched alkyl group having 1 to 8 carbon atoms, desirably a hydrogen atom (unsubstituted) or a linear alkyl group having 3 to 6 carbon atoms, and more desirably a hydrogen atom (unsubstituted).

In Chemical Formula (1), $L_1$ represents a substituted or unsubstituted divalent aromatic hydrocarbon group having 6 to 25 carbon atoms, or a substituted or unsubstituted divalent aromatic heterocyclic group having 6 to 25 carbon atoms. Herein, the aromatic hydrocarbon group is not particularly limited, but may be an aromatic hydrocarbon group having 6 to 25 carbon atoms. Specifically, it may be a divalent group derived from aromatic hydrocarbons such as benzene (phenylene group), pentalene, indene, naphthalene, anthracene, azulene, heptalene, acenaphthene, phenalene, fluorene, phenanthrene, biphenyl, terphenyl, quater phenyl, quinquephenyl, sexyphenyl, pyrene, 9,9-diphenylfluorene, 9,9'-spirobi[fluorene], and 9,9-dialkyl fluorene. Further, the aromatic heterocyclic group is not particularly limited, but may be an aromatic heterocyclic group having 12 to 25 carbon atoms. Specifically, it may be a divalent group derived from heterocyclic cyclic aromatic compounds such as acridine, phenazine, benzoquinoline, benzoisoquinoline, phenanthridine, phenanthroline, anthraquinone, fluorenone, dibenzofuran, dibenzothiophene, carbazole, imidazophenanthridine, benzimidazophenanthridine, azadibenzofuran, 9-phenylcarbazole, azacarbazole, azadibenzothiophene, diazadibenzofuran, diazacarbazole, diazadibenzothiophene, xanthone, oxanthone, pyridine, quinoline, and anthraquinoline. Among these, $L_1$ may be desirably a divalent group derived from benzene, fluorene, dibenzofuran, dibenzothiophene, and biphenyl. More desirably, $L_1$ is a divalent group derived from a compound benzene (o,m,p-phenylene group), dibenzofuran, and fluorene. Particularly, $L_1$ may be desirably a phenylene group (especially a p-phenylene group). With such an $L_1$, a higher hole injection property, a higher triplet energy level, a lower driving voltage and a film forming property, or a balance of any two or more of them (especially the balance between the hole injection property and the film forming property) may be achieved. On the other hand, in the above embodiment, $L_1$ may be unsubstituted, or any one hydrogen atom may be replaced by a substituent.

Herein, the number substituents when any one of the hydrogen atoms in $L_1$ is substituted is not particularly limited, but is desirably 1 to 3, more desirably 1 to 2, and particularly desirably 1. When $L_1$ has a substituent, the bonding position of the substituent is not particularly limited. The substituent is desirably present as far as possible away with respect to the nitrogen atom of the main chain to which $L_1$ is linked. By the presence of a substituent at such a position, a higher hole injection property, a higher triplet energy level, a lower driving voltage, and a film forming property, or a balance of any two or more of them (especially the balance between the hole injection property and the film forming property) may be achieved.

In addition, the substituent which may exist when any one hydrogen atom in $L_1$ is replaced is not particularly limited, and may be an alkyl group, a cycloalkyl group, a hydroxyalkyl group, an alkoxyalkyl group, an alkoxy group, a cycloalkoxy group, an alkenyl group, an alkynyl group, an amino group, an aryl group, an aryloxy group, an alkylthio group, a cycloalkylthio group, an arylthio group, an alkoxycarbonyl group, an aryloxycarbonyl group, a hydroxy group (—OH), a carboxyl group (—COOH), a thiol group (—SH), a cyano group (—CN), and the like.

Herein, the alkyl group may be linear or branched, and may be desirably a linear alkyl group having 1 to 18 carbon atoms or a branched alkyl group having 1 to 18 carbon atoms. Specifically, it may be a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isopropylbutyl group, a 1-ethyl-3-methyl butyl group, an n-octyl group, a 2-ethylhexyl group, a 3-methyl-1-isopropylbutyl group, a 2-methyl-1-isopropyl group, a 1-tert-butyl-2-methylpropyl group, an n-nonyl group, a 3,5,5-trimethylhexyl group, an n-decyl group, an isodecyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, and the like.

The cycloalkyl group may be a cyclopropyl group, a cyclobutyl group, a cyclopentyl group, a cyclohexyl group, and the like.

The hydroxyalkyl group may be, for example, an alkyl group substituted with 1 to 3 (desirably 1 to 2, and more desirably 1) hydroxyl groups (e.g., hydroxymethyl group or hydroxyethyl group).

The alkoxyalkyl group may be, for example, the alkyl group substituted with 1 to 3 (desirably 1 to 2, and more desirably 1) alkoxy groups.

The alkoxy group may include, for example, a methoxy group, an ethoxy group, a propoxy group, an isopropoxy group, a butoxy group, a pentyloxy group, a hexyloxy group, a heptyloxy group, an octyloxy group, a nonyloxy group, a decyloxy group, an undecyloxy group, a dodecyloxy group, a tridecyloxy group, a tetradecyloxy group, a pentadecyloxy group, a hexadecyloxy group, a heptadecyloxy group, an octadecyloxy group, a 2-ethylhexyloxy group, and a 3-ethylpheneyloxy group.

The cycloalkoxy group may include, for example, a cyclopropyloxy group, a cyclobutyloxy group, a cyclopentyloxy group, a cyclohexyloxy group, and the like.

The alkenyl group may include, for example, a vinyl group, an allyl group, a 1-propenyl group, an isopropenyl group, a 1-butenyl group, a 2-butenyl group, a 3-butenyl group, a 1-pentenyl group, a 2-pentenyl group, a 3-pentenyl group, a 1-hexenyl group, a 2-hexenyl group, a 3-hexenyl group, a 1-heptenyl group, a 2-heptenyl group, a 5-heptenyl group, a 1-octenyl group, a 3-octenyl group, a 5-octenyl group, and the like.

The alkynyl group may include, for example, an acetylenyl group, a 1-propynyl group, a 2-propynyl group, a 1-butynyl group, a 2-butynyl group, a 3-butynyl group, a 1-pentetyl group, a 2-pentetyl group, a 3-pentetyl group, a 1-hexynyl group, a 2-hexynyl group, a 3-hexynyl group, a 1-heptynyl group, a 2-heptynyl group, a 5-heptynyl group, a 1-octinyl group, a 3-octinyl group, a 5-octinyl group, and the like.

The aryl group may include, for example, a phenyl group, a naphthyl group, a biphenyl group, a fluorenyl group, an anthryl group, a pyrenyl group, an azrenyl group, an acenaphthylenyl group, a terphenyl group, a phenanthryl group, and the like.

The aryloxy group may include, for example, a phenoxy group, a naphthyloxy group, and the like.

The alkyl thio group may include, for example, a methylthio group, an ethyl thio group, a propylthio group, a pentylthio group, a hexyl thio group, an octylthio group, a dodecylthio group, and the like.

The cycloalkylthio group may include, for example, a cyclopentylthio group, a cyclohexylthio group, and the like.

The arylthio group may include, for example, a phenylthio group, a naphthylthio group, and the like.

The alkoxyloxy carbonyl group may include, for example, a methyloxy carbonyl group, an ethyloxy carbonyl group, a butyloxy carbonyl group, an octyloxy carbonyl group, a dodecyloxycarbonyl group, and the like.

The aryloxycarbonyl group may include, for example, a phenyloxycarbonyl group, a naphthyloxycarbonyl group, and the like.

Among the above, $L_1$ may be one of the following groups. In other words, in a preferred embodiment of the present disclosure, in Chemical Formula (1), x may be 1 or 2 (desirably 1), and $L_1$ may be one of the following groups. On the other hand, in the following structures, $R_{111}$ to $R_{125}$ each independently represent a hydrogen atom or a linear hydrocarbon group having 1 to 16 carbon atoms or a branched hydrocarbon group having 1 to 16 carbon atoms (desirably, $R_{111}$ to $R_{125}$ are hydrogen atoms).

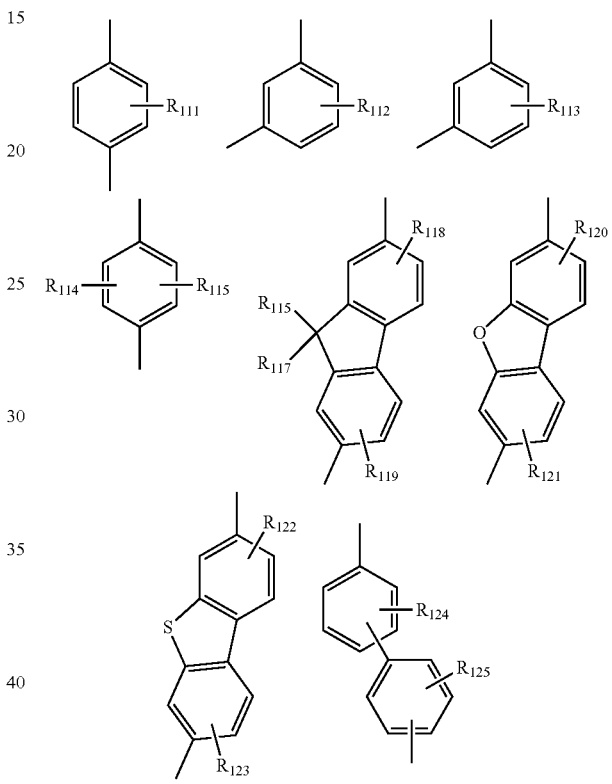

In Chemical Formula (1), x is 0, 1 or 2. Meanwhile, when x is 2, $L_1$ may be the same or different, respectively. From the viewpoint of a higher hole injection property, a higher triplet energy level, a lower driving voltage, a film forming property, or a balance of any two or more of them (especially the balance between hole injection property and film forming property), x may be 0 or 1, desirably 1.

In Chemical Formula (1), $L_2$ represents a substituted or unsubstituted divalent or trivalent aromatic hydrocarbon group having 6 to 25 carbon atoms or a substituted or unsubstituted divalent or trivalent aromatic heterocyclic group. Herein, $L_2$ may form a ring with $Ar_1$. On the other hand, when $L_2$ forms a ring with $Ar_1$, $L_2$ is a trivalent group. When $L_2$ does not form a ring with $Ar_1$, $L_2$ is a divalent group.

Herein, the aromatic hydrocarbon group having 6 to 25 carbon atoms and the aromatic heterocyclic group as $L_2$ are not particularly limited. When $L_2$ does not form a ring with $Ar_1$, a divalent group derived from an aromatic hydrocarbon having 6 to 25 carbon atoms defined in $L_1$ may be exemplified. Likewise, in the above case, the aromatic heterocyclic group as $L_2$ is not particularly limited, but a divalent group derived from the heterocyclic cyclic aromatic compound defined in $L_1$ may be exemplified. In addition, when $L_2$ forms a ring with $Ar_1$, a divalent group derived from an aromatic hydrocarbon having 6 to 25 carbon atoms defined in $L_1$ may be changed into a trivalent group. Likewise, in the above case, the aromatic heterocyclic group as $L_2$ is not particularly limited, but the divalent group derived from the heterocyclic cyclic aromatic compound defined in $L_1$ may be changed into a trivalent group. Among these, a divalent or trivalent group derived from benzene, fluorene, dibenzofuran, dibenzothiophene or biphenyl may be desirable. More desirably, $L_2$ may be a divalent group derived from benzene, fluorene, or dibenzofuran (e.g., o,m, or p-phenylene group) or a trivalent group (e.g., 1,3,4-substituted phenylene group). More desirably, $L_2$ may be a benzene-derived divalent group (phenylene group, particularly p-phenylene group) or a trivalent group (especially 1,3,4-substituted phenylene group). With such an $L_2$, a higher hole injection property, a higher triplet energy level, a lower driving voltage, a film forming property, or a balance of any two or more of them (especially the balance between the hole injection property and the film forming property) may be achieved. On the other hand, in the above desirable embodiment, $L_2$ may be unsubstituted or any hydrogen atom may be replaced by a substituent. In addition, the substituent which is present and obtained when any one of the hydrogen atoms in $L_2$ is replaced is not particularly limited, and the same examples as in $L_1$ may be applied. Desirably, $L_2$ may be unsubstituted.

In Chemical Formula (1), $Ar_1$ represents a substituted or unsubstituted divalent aromatic hydrocarbon group having 6 to 25 carbon atoms or a substituted or unsubstituted divalent aromatic heterocyclic group.

Herein, the aromatic hydrocarbon group having 6 to 25 carbon atoms as $Ar_1$ is not particularly limited, but a divalent group derived from an aromatic hydrocarbon having 6 to 25 carbon atoms defined in $L_1$ may be exemplified. Likewise, the aromatic heterocyclic group as $Ar_1$ is not particularly limited, but a divalent group derived from the heterocyclic aromatic compound defined in $L_1$ may be exemplified. Among these, a phenylene group, a biphenylene group, a dibenzofuranyl group, or a fluorenyl group may be desirable. More desirably, $Ar_1$ may be a phenylene group (o,m,p-phenylene group). More desirably, $Ar_1$ may be an o-phenylene group. With such $Ar_1$, a higher hole injection property, a higher triplet energy level, a lower driving voltage, a film forming property, or a balance of any two or more of them (especially the balance between the hole injection property and the film forming property) may be achieved. On the other hand, $Ar_1$ may be unsubstituted, or any one hydrogen atom may be replaced by a substituent. On the other hand, the substituent which may exist when any one hydrogen atom in $Ar_1$ is replaced is not particularly limited, and the same substituents as described in relation to $L_1$ may be applied. $Ar_1$ may be desirably a divalent group derived from benzene that is unsubstituted or substituted with a linear alkyl group having 3 to 10 carbon atoms or a branched alkyl group having 3 to 10 carbon atoms, a biphenylene that is unsubstituted or substituted with a linear alkyl group having 3 to 10 carbon atoms or a branched alkyl group having 3 to 10 carbon atoms, or a fluorene that is unsubstituted or substituted with a linear alkyl group having 3 to 10 carbon atoms or a branched alkyl group having 3 to 10 carbon atoms. More desirably, $Ar_1$ may be an o, m, p-phenylene group that is unsubstituted or substituted with a linear alkyl group having 3 to 10 carbon atoms or a branched alkyl group having 3 to 10 carbon atoms, and more desirably an o-phenylene group that is unsubstituted or substituted with a linear alkyl group having 5 to 8 carbon atoms. On the other hand, in the case where $Ar_1$ has a substituent (i.e., a substituted divalent aromatic hydrocarbon group having 6 to 25 carbon atoms or a substituted divalent aromatic heterocyclic group), the position of the substituent is not particularly limited, but it is desirable that the substituent may exist as far away as possible with respect to the nitrogen atom bound to $Ar_1$. For example, when $Ar_1$ is an o-phenylene group, the substituent is desirably present in a para position with respect to the nitrogen atom. Without wishing to be bound by theory, at this position, a distance between the alternating copolymer and the quantum dot becomes closer, and an interaction between the aryl amine-fluorene alternating copolymer in the hole transport layer and the quantum dot in the light-emitting layer becomes stronger, so that the hole injection property (i.e., durability (luminescence life-span)) may be further improved.

In addition, $Ar_1$ forms a ring with $Ar_2$ or $L_2$. In this way, when $Ar_1$ forms a ring with $Ar_2$ or $L_2$, a higher triplet energy level may be provided. Among these, from the viewpoint of a higher hole injection property, a higher triplet energy level, a lower driving voltage, a film forming property, or a balance of any two or more of them (especially the balance between hole injection property and film forming property), $Ar_1$ may form a ring with $L_2$. When $Ar_1$ forms a ring with $L_2$, a ring structure formed by $Ar_1$ and $L_2$ is not particularly limited, but it is desirable to form a carbazole ring with $Ar_1$ and $L_2$. In other words, in an embodiment of the present disclosure, $-L_2-N\ Ar_1$, and $Ar_2$ in Chemical Formula (1) has one of the following structures.

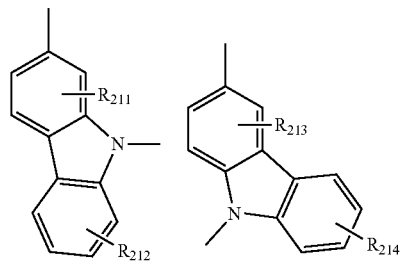

$R_{211}$ to $R_{214}$ are independently a hydrogen atom or a linear alkyl group having 3 to 10 carbon atoms or a branched alkyl group having 3 to 10 carbon atoms.

More desirably, $Ar_1$ and $L_2$ may form a carbazole ring of the following structure.

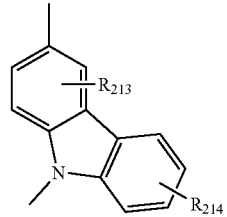

$R_{211}$ to $R_{214}$ are independently a hydrogen atom or a linear alkyl group having 3 to 10 carbon atoms or a branched alkyl group having 3 to 10 carbon atoms. Desirably, $R_{211}$ and $R_{213}$ may be a hydrogen atom and $R_{212}$ and $R_{214}$ may be a hydrogen atom or a linear alkyl group having 5 to 8 carbon atoms.

In Chemical Formula (1), $Ar_2$ represents a monovalent or divalent aromatic hydrocarbon group having 6 to 25 carbon atoms or a monovalent or divalent aromatic heterocyclic group wherein the aromatic hydrocarbon group or aromatic heterocyclic group is substituted with a linear or branched hydrocarbon group having 1 to 12 carbon atoms. Herein, $Ar_2$ may form a ring with $Ar_1$. On the other hand, when $Ar_2$ forms a ring with $Ar_1$, $Ar_2$ is a divalent group. When $Ar_2$ does not form a ring with $Ar_1$, $Ar_2$ is a monovalent group.

Herein, the aromatic hydrocarbon group having 6 to 25 carbon atoms and the aromatic heterocyclic cyclic group as $Ar_2$ are not particularly limited. When $Ar_2$ does not form a ring with $Ar_1$, a divalent group derived from an aromatic hydrocarbon having 6 to 25 carbon atoms defined in $L_1$ may be a monovalent group. Likewise, in the above case, the aromatic heterocyclic group as $Ar_2$ is not particularly limited, but the divalent group derived from the heterocyclic cyclic aromatic compound defined in $L_1$ may be a monovalent group. In addition, when $Ar_2$ forms a ring with $Ar_1$, a divalent group derived from an aromatic hydrocarbon having 6 to 25 carbon atoms specified in $L_1$ may be exemplified. Likewise, in the above case, the aromatic heterocyclic group as $Ar_2$ is not particularly limited, but a divalent group derived from the heterocyclic cyclic aromatic compound defined in $L_1$ may be exemplified. Among these, $Ar_2$ may be desirably a divalent group derived from benzene, biphenyl, dibenzofuranyl group, or fluorenyl group. More desirably, $Ar_2$ may be a benzene-derived divalent group (phenyl group or o,m,p-phenylene group). More desirably, $Ar_2$ may be a phenyl group when $Ar_2$ does not form a ring with $Ar_1$, or may be an o-phenylene group when $Ar_2$ forms a ring with $Ar_1$. With such $Ar_2$ (unsubstituted form), a higher hole injection property, a higher triplet energy level, a lower driving voltage, a film forming property, or a balance of any two or more of them (especially the balance between the hole injection property and the film forming property) may be achieved. On the other hand, in the above embodiment, $Ar_2$ may be unsubstituted, or any one hydrogen atom may be replaced by a substituent.

Moreover, $Ar_2$ may have a linear hydrocarbon group having 1 to 12 carbon atoms or a branched hydrocarbon group having 1 to 12 carbon atoms as a substituent. By such a hydrocarbon group at the terminal end of the aryl amine-fluorene alternating copolymer, the alternating copolymer according to the present disclosure in the hole transport layer may closely interact with the quantum dot in the light-emitting layer, so that holes may be efficiently injected into the quantum dot (high hole injection property), and the durability (luminescence life-span) may be improved. Herein, the hydrocarbon group having 1 to 12 carbon atoms is not particularly limited, and examples thereof include a linear or branched alkyl group, alkenyl group, or alkynyl group, and a cycloalkyl group. On the other hand, when $Ar_2$ is an alkenyl group or an alkynyl group, $Ar_2$ may have 2 to 16 carbon atoms. Likewise, when $Ar_2$ is a cycloalkyl group, $Ar_2$ may have 3 to 6 carbon atoms.

Herein, the alkyl group having 1 to 12 carbon atoms may include, for example, a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isopropylpropyl group, a 1-ethyl-3-methylbutyl group, an n-octyl group, a 2-ethylhexyl group, a 3-methyl-1-isopropylbutyl group, a 2-methyl-1-isopropyl group, a 1-tert-butyl-2-methylpropyl group, an n-nonyl group, a 3,5,5-trimethylhexyl group, an n-decyl group, an isodecyl group, an n-undecyl group, a 1-methyldecyl group, an n-dodecyl group, and the like.

The alkyl group having 2 to 16 carbon atoms may include, for example, a vinyl group, an allyl group, a 1-propenyl group, a 2-butenyl group, a 1,3-butadienyl group, a 2-pentenyl group, an isopropenyl group, and the like.

The alkyl group having 2 to 16 carbon atoms may include, for example, an ethynyl group, a propargyl group, and the like.

The cycloalkyl group having 3 to 6 carbon atoms may include, for example, a cyclopropyl group, a cyclobutyl group, a cyclopentyl group, a cyclohexyl group, and the like.

Among these, from the viewpoint of a higher hole injection property, a higher triplet energy level, a lower driving voltage, and a film forming property, or a balance of any two or more of them (particularly, a balance between hole injection property and film forming property), the hydrocarbon group of Are may be a linear alkyl group having 4 to 10 carbon atoms or a branched alkyl group having 4 to 10 carbon atoms. By increasing the carbon number of the hydrocarbon group of $Ar_2$ (in a long chain), since a distance between the alternating copolymer and the quantum dot becomes closer, and an interaction between the alternating arylamine-fluorene copolymer in the hole transport layer and the quantum dot in the light-emitting layer becomes stronger, a hole injection property (i.e., durability (luminescence life-span)) may be further improved. In other words, in an embodiment of the present disclosure, $Ar_2$ is a group derived from benzene, biphenyl, dibenzofuran or fluorene, and at the same time, is substituted with a linear alkyl group having 4 to 10 carbon atoms or a branched alkyl group having 4 to 10 carbon atoms. More desirably, $Ar_2$ may be a linear alkyl group having 5 to 8 carbon atoms. In other words, in an embodiment of the present disclosure, $Ar_2$ is a benzene-derived group (phenyl group, o, m, p-phenylene group) substituted with a linear alkyl group having 5 to 8 carbon atoms. More desirably, $Ar_2$ is a linear alkyl group having 6 to 8 carbon atoms. In other words, in an embodiment of the present disclosure, $Ar_2$ may be a phenyl group (when $Ar_2$ does not form a ring with $Ar_1$) or may be an o-phenylene group ($Ar_2$ forms a ring with $Ar_1$) substituted in a linear alkyl group having 6 to 8 carbon atoms.

On the other hand, the position of the hydrocarbon group of $Ar_2$ is not particularly limited, but it is desirable to exist at a position as far away as possible from the nitrogen atom of $-L_2-N(Ar_1)(Ar_2)$. For example, when $Ar_1$ forms a ring with $L_2$ and $Ar_2$ is a phenyl group, it is desirable that the hydrocarbon group is present in the para position with respect to the nitrogen atom. Without wishing to be bound by theory, at such a position, since a distance between the alternating copolymer and the quantum dot becomes closer, and an interaction between the arylamine-fluorene alternating copolymer in the hole transport layer and the quantum dot in the light-emitting layer becomes stronger, a hole injection property (i.e., durability (luminescence life-span)) may be further improved.

When $Ar_2$ forms a ring with $Ar_1$, a ring structure formed by $Ar_2$ and $Ar_1$ is not particularly limited, but it is desirable to form a carbazole ring with $Ar_2$ and $Ar_1$. In other words, in an embodiment of the present disclosure, in Chemical Formula (1), $Ar_1$ may form a ring with $Ar_2$, and $—N(Ar_1)(Ar_2)$ may be one of the following groups.

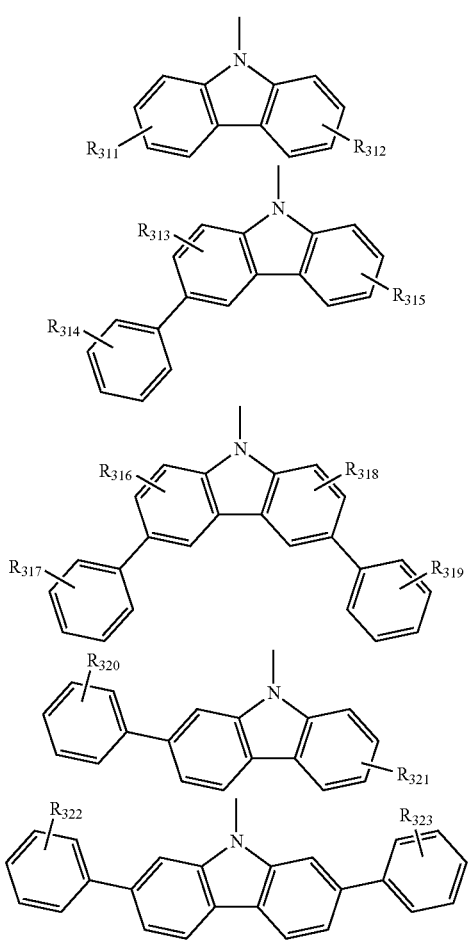

Therefore, the structural unit (A) according to the present disclosure may be one of the following groups.

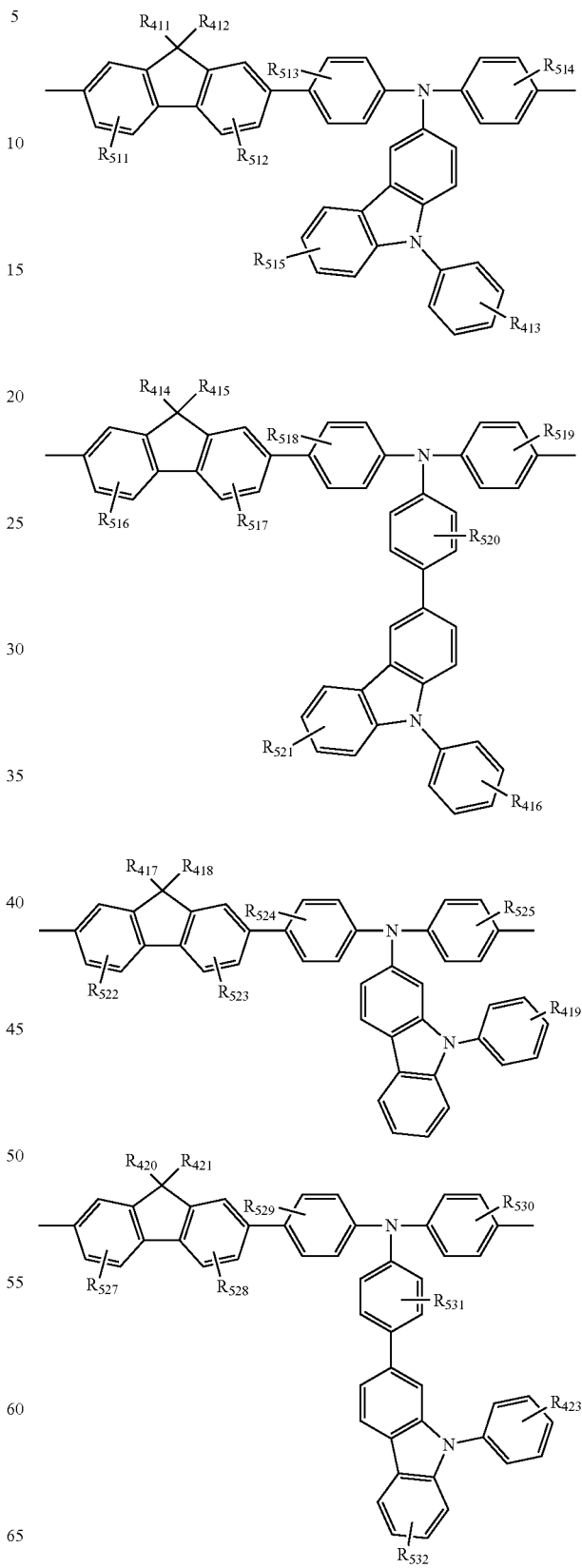

$R_{311}$ to $R_{323}$ independently represent a hydrogen atom or a hydrocarbon group having 1 to 16 carbon atoms, and at least one of $R_{311}$ to $R_{323}$ may be a linear hydrocarbon group having 1 to 12 carbon atoms or branched hydrocarbon group having 1 to 12 carbon atoms (desirably, a linear hydrocarbon group having 4 to 10 carbon atoms or branched hydrocarbon group having 4 to 10 carbon atoms, more desirably, a linear alkyl group having 5 to 8 carbon atoms or a linear alkyl group having 6 to 8 carbon atoms.

More desirably, $Ar_2$ and $Ar_1$ may form a carbazole ring having the following structures. In other words, in an embodiment of the present disclosure, —N($Ar_1$)($Ar_2$) in Chemical Formula (1) has the following structure.

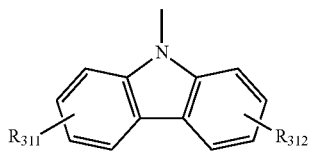

$R_{311}$ represents a hydrogen atom or a linear alkyl group having 4 to 10 carbon atoms or a branched alkyl group having 4 to 10 carbon atoms (more desirably a hydrogen atom or a linear alkyl group having 5 to 8 carbon atoms), and $R_{312}$ represents a linear alkyl group having 4 to 10 carbon atoms or a branched alkyl group having 4 to 10 carbon atoms (more desirably a linear alkyl group having 5 to 8 carbon atoms or a linear alkyl group having 6 to 8 carbon atoms).

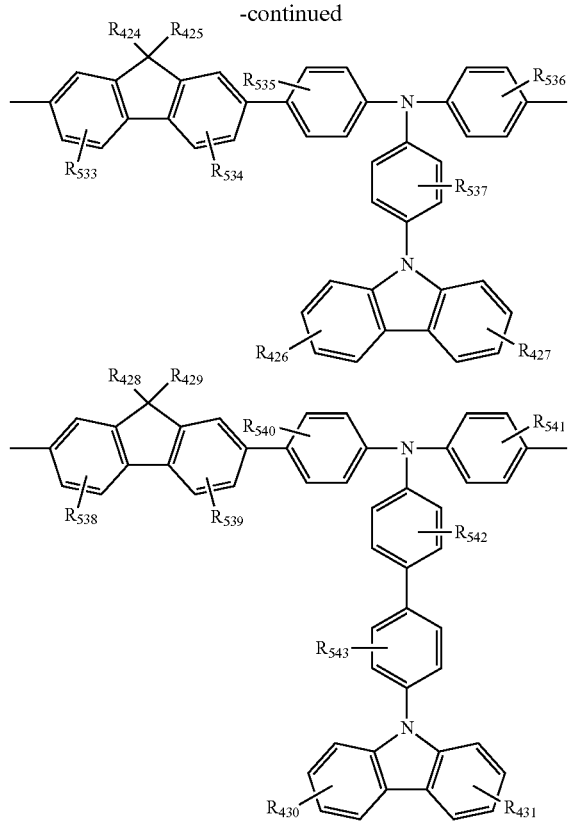

$R_{411}$ to $R_{431}$ independently represent a linear having alkyl group having 1 to 12 carbon atoms or a branched alkyl group having 1 to 12 carbon atoms, and $R_{511}$ to $R_{543}$ independently represent a hydrogen atom or a hydrocarbon group having 1 to 16 carbon atoms.

The composition of the structural unit (A) in the arylamine-fluorene alternating copolymer of the present disclosure is not particularly limited. Considering the improved durability (luminescence life-span) and hole transport ability of the layer (e.g., hole injection layer or hole transport layer) formed using the obtained arylamine-fluorene alternating copolymer, the structural unit (A) may be desirably included in an amount of greater than or equal to about 10 mol % and less than or equal to about 100 mol %, more desirably greater than about 50 mol % and less than or equal to about 100 mol %, and even more desirably about 100 mol % % based on the total structural units constituting the aryl amine-fluorene alternating copolymer. In other words, in an embodiment of the present disclosure, the structural unit (A) is included in a proportion of greater than or equal to about 10 mol % and less than or equal to about 100 mol % % based on the total structural units. In a desirable embodiment of the present disclosure, the structural unit (A) may be included in a proportion of greater than about 50 mol % and less than or equal to about 100 mol % based on the total structural units. In a more desirable embodiment of the present disclosure, the arylamine-fluorene alternating copolymer is composed of the structural unit (A) alone (that is, the ratio of the structural unit (A) to the total structural units=100 mol %). On the other hand, when the arylamine-fluorene alternating copolymer includes two or more types of structural units (A), a content of the structural units (A) means a sum mount of the structural units (A).

As described above, the aryl amine-fluorene alternating copolymer of the present disclosure may be composed of the structural unit (A) alone. Alternatively, the arylamine-fluorene alternating copolymer of the present disclosure may further include other structural units other than the structural unit (A). Other structural units are not particularly limited unless the effect of the arylamine-fluorene alternating copolymer (especially high triplet energy level, low driving voltage) is impaired. Specifically, the structural units the following group may be exemplified. On the other hand, hereinafter, the structural units shown in the following group are also referred to as a "structural unit (B)."

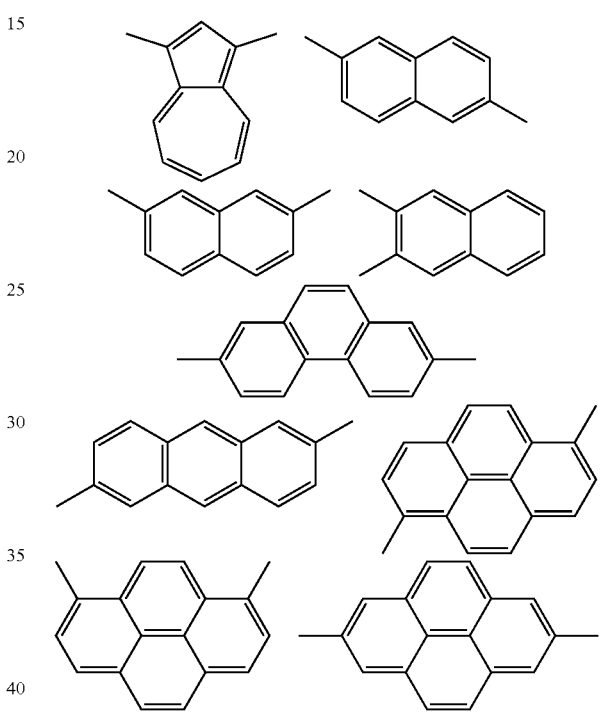

The composition of the structural unit (B) in the arylamine-fluorene alternating copolymer of the present embodiment is not particularly limited. Considering the effect of further improving film forming ease and film strength by the resulting polymer compound, the structural unit (B) may be desirably greater than or equal to about 1 mol % and less than or equal to about 10 mol % based on the total structural units constituting the arylamine-fluorene alternating copolymer. On the other hand, when the arylamine-fluorene alternating copolymer contains two or more types of structural units (B), a content of the structural units (B) means a sum amount of the structural units (B).

A weight average molecular weight (Mw) of the arylamine-fluorene alternating copolymer is not particularly limited as long as the object and effect of the present disclosure are obtained. The weight average molecular weight (Mw) may be desirably greater than or equal to about 12,000 and less than or equal to about 1,000,000, and more desirably greater than or equal to about 50,000 and less than or equal to about 500,000. Within the weight average molecular weight ranges, viscosity of the coating liquid for forming a layer (e.g., a hole injection layer or a hole transport layer) using the arylamine-fluorene alternating copolymer is appropriately adjusted, and a layer having a uniform film thickness may be formed.

In addition, the number average molecular weight (Mn) of the arylamine-fluorene alternating copolymer is not particularly limited as long as the object and an effect of the present disclosure are obtained. The number average molecular weight (Mn) may be, for example, greater than or equal to about 10,000 and less than or equal to about 250,000, and more desirably greater than or equal to about 30,000 and less than or equal to about 100,000. Within the number average molecular weight ranges, viscosity of the coating solution for forming a layer (e.g., a hole injection layer or a hole transport layer) using the arylamine-fluorene alternating copolymer is appropriately adjusted, and a layer having a uniform film thickness may be formed. The polydispersity (weight average molecular weight/number average molecular weight) of the arylamine-fluorene alternating copolymer of this embodiment may be, for example, greater than or equal to about 1.2 and less than or equal to about 4.0, and desirably greater than or equal to about 1.5 and less than or equal to about 3.5.

In the present specification, the measurement of the number average molecular weight (Mn) and the weight average molecular weight (Mw) is not particularly limited and may be applied by using a known method or by appropriately changing the known methods. In the present specification, the number average molecular weight (Mn) and the weight average molecular weight (Mw) use values measured by the following method. The polydispersity (Mw/Mn) of the polymer is calculated by dividing the weight average molecular weight (Mw) by the number average molecular weight (Mn) measured by the following method.

Measurement of Number Average Molecular Weight (Mn) and Weight Average Molecular Weight (Mw)

The number average molecular weight (Mn) and the weight average molecular weight (Mw) of the polymer material are measured under the following conditions by SEC (Size Exclusion Chromatography) using polystyrene as a standard material.

SEC Measurement Conditions

Analysis equipment (SEC): Shimadzu Corporation, Prominence

Column: Polymer Laboratories, PLgel MIXED-B

Column temperature: 40° C.

Flow rate: 1.0 mL/min

Injection amount of sample solution: 20 μL (concentration: about 0.05 mass %)

Eluent: tetrahydrofuran (THF)

Detector (UV-VIS detector): Shimadzu Corporation, SPD-10AV

Standard sample: polystyrene.

A terminal end of the main chain of the arylamine-fluorene alternating copolymer of the present embodiment is not particularly limited, but is usually hydrogen depending on the type of the used raw material.

The arylamine-fluorene alternating copolymer of the present embodiment may be synthesized by using a known organic synthesis method. The specific synthesis method of the arylamine-fluorene alternating copolymer of the present embodiment may be easily understood by a person of an ordinary skill in the art referring to the following examples. Specifically, the arylamine-fluorene alternating copolymer of the present embodiment may be prepared by a polymerization reaction using at least one monomer (1)' represented by Chemical Formula (1)', or by a copolymerization reaction at least one monomer (1)' represented by Chemical Formula (1)' and other monomers corresponding to the other structural units described above.

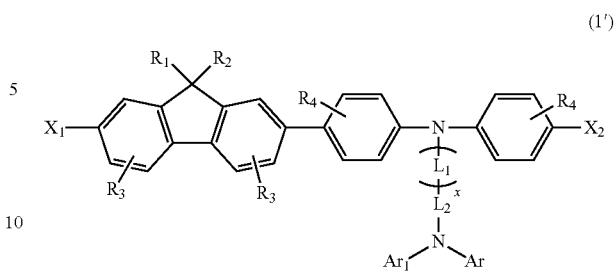

(1')

Alternatively, it may be prepared by a copolymerization reaction of at least one monomer (2) represented by Chemical Formula (2') and at least one monomer (3) represented by Chemical Formula (3'), or a copolymerization reaction of at least one monomer (2) represented by Chemical Formula (2'), at least one monomer (3) represented by Chemical Formula (3'), and other monomers corresponding to the other structural units described above.

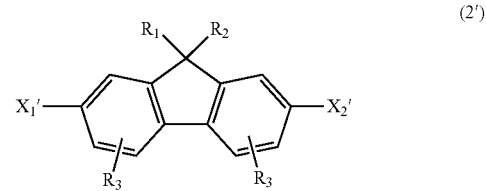

(2')

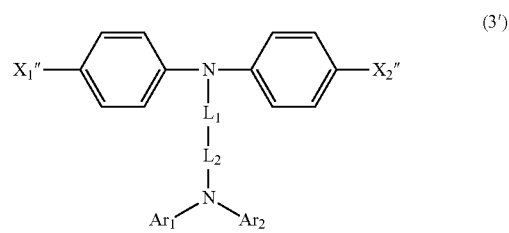

(3')

In the present disclosure, the monomers used in the polymerization of the arylamine-fluorene alternating copolymer may be synthesized by appropriately combining known synthetic reactions, and the structure may be confirmed by known methods (for example, NMR, LC-MS, etc.).

In Chemical Formulas (1') to (3'), $R_1$ to $R_4$, $L_1$, $L_2$, $Ar_1$, $Ar_2$, and x are defined in the same manner as in Chemical Formula (1). $X_1$ and $X_2$ are independently a halogen atom (a fluorine atom, a chlorine atom, a bromine atom, an iodine atom, especially a bromine atom) or a group having the following structure. On the other hand, in the following structures, $R_A$ to $R_D$ may independently be an alkyl group having 1 to 3 carbon atoms. Desirably, $R_A$ to $R_D$ may be a methyl group. Incidentally, $X_1$ and $X_2$ in Chemical Formulas (1') to (3') may be the same or different, respectively. Desirably, in Chemical Formula (1'), $X_1$ and $X_2$ may be different. In Chemical Formula (2'), $X_1'$ and $X_2'$ may be the same. In Chemical Formula (3'), $X_1''$ and $X_2''$ may be the same.

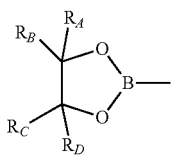

The aryl amine-fluorene alternating copolymer of this embodiment has a structural unit (A). For this reason, the aryl amine-fluorene alternating copolymer may have high hole injection properties. Therefore, when the arylamine-fluorene alternating copolymer according to the present embodiment is used as a hole injection material or a hole transport material (especially a hole transport material), durability (luminescence life-span) may be achieved. Further, the arylamine-fluorene alternating copolymer of the present embodiment has a high triplet energy level and a low driving voltage at the same time. Therefore, when the aryl amine-fluorene alternating copolymer according to the present embodiment is used as a hole injection material or a hole transport material (especially a hole transport material), high hole mobility is achieved with a low driving voltage. Therefore, durability (luminescence life-span) and luminous efficiency of the electroluminescence device using the arylamine-fluorene alternating copolymer according to the present embodiment is improved.

Electroluminescence Device Material

The arylamine-fluorene alternating copolymer according to the present embodiment is desirably used as an electroluminescence device material. According to the aryl amine-fluorene alternating copolymer according to the present embodiment, an electroluminescence device material having improved durability (luminescence life-span) and high hole mobility is provided. Further, according to the arylamine-fluorene alternating copolymer according to the present embodiment, an electroluminescence device material having a high triplet energy level (current efficiency) and a low driving voltage is also provided. Further, the main chain (structural unit of Chemical Formula (1)) of the aryl amine-fluorene alternating copolymer has appropriate flexibility. For this reason, the arylamine-fluorene alternating copolymer according to the present embodiment exhibits high solubility in a solvent and high heat resistance. Therefore, a film (thin film) may be easily formed by a wet (coating) method. Accordingly, in a second embodiment, an electroluminescence device material including the arylamine-fluorene alternating copolymer of the present disclosure is provided. Alternatively, a use of an aryl amine-fluorene alternating copolymer as an electroluminescence device material is provided.

In addition, the aryl amine-fluorene alternating copolymer according to the present embodiment may have a HOMO level of greater than about 5.20 eV, particularly greater than or equal to about 5.33 eV. For this reason, the arylamine-fluorene alternating copolymer according to the present embodiment may be suitably used also for a quantum dot electroluminescence device (especially a hole transport layer).

Electroluminescence Device

As described above, the arylamine-fluorene alternating copolymer according to the present embodiment may be desirably used for an electroluminescence device. In other words, an electroluminescence device includes a pair of electrodes and one or more layers of organic films disposed between the electrodes and including the arylamine-fluorene alternating copolymer or an electroluminescence device material of the present embodiment. Such an electroluminescence device may exhibit improved luminous efficiency with a low driving voltage. Accordingly, in a third embodiment, the present disclosure provides an electroluminescence device including a first electrode, a second electrode, and one or more organic films disposed between the first electrode and the second electrode, wherein at least one layer of the organic film includes the arylamine-fluorene alternating copolymer of the present disclosure. The object (or effect) of the present disclosure may also be achieved in the electroluminescence device according to the present embodiment. As a desirable embodiment, the electroluminescence device may further include a light-emitting layer disposed between the electrodes and including a light-emitting material capable of emitting light from triplet excitons. On the other hand, the electroluminescence device of the present embodiment is an example of the electroluminescence device according to the present disclosure.

In addition, in this embodiment, a method of manufacturing the electroluminescence device including a pair of electrodes and one or more layers of an organic film including the alternating arylamine-fluorene copolymer of the present embodiment disposed between the electrodes is provided. At least one layer of the organic film is formed by a coating method. Further, by such a method, the present embodiment provides an electroluminescence device in which at least one layer of the organic film is formed by a coating method.

The aryl amine-fluorene alternating copolymer of the present embodiment, and the electroluminescence device material (EL device material) according to the present embodiment (hereinafter collectively referred to as "arylamine-fluorene alternating copolymer/EL device material") have improved solubility in organic solvents. For this reason, the arylamine-fluorene alternating copolymer/EL element material according to the present embodiment is desirably used in the production of a device (especially a thin film) by a coating method (wet process). Accordingly, this embodiment provides a liquid composition including the arylamine-fluorene alternating copolymer of this embodiment and a solvent or a dispersion medium. Such a liquid composition is an example of the liquid composition according to the present disclosure.

In addition, as described above, the electroluminescence device material according to the embodiment is desirably used for manufacture of a device (particularly thin film) by a coating method (wet process). In view of the above, this embodiment provides a thin film including the arylamine-fluorene alternating copolymer of this embodiment. Such a thin film is an example of a thin film according to the present disclosure.

Further, the EL device material according to the present embodiment has improved hole injection properties and hole mobility. For this reason, it may also be suitably used for formation of any organic film, such as a hole injection material, a hole transport material, or a light-emitting material (host). Among these, from the viewpoint of hole transport properties, it may be desirably used as a hole injection material or a hole transport material, and more desirably as a hole transport material.

That is, the present embodiment provides a composition including the arylamine-fluorene alternating copolymer and at least one of a hole transport material, an electron transport material, a light-emitting material, or a combination thereof. Herein, the light-emitting material included in the composition is not particularly limited, but may include an organometallic complex (a light-emitting organometallic complex compound) or a semiconductor nanoparticle (semiconductor inorganic nanoparticle).

Electroluminescence Device

Hereinafter, referring to FIGURE, an electroluminescence device according to the present embodiment is described in detail. FIG. 1s a schematic view showing an electroluminescence device according to the present embodiment. In addition, in this specification, an "electroluminescence device" may be abbreviated as "EL device."

As shown in FIGURE, the EL device 100 according to the present embodiment includes a substrate 110, a first electrode 120 disposed on the substrate 110, a hole injection layer 130 disposed on the first electrode 120, a hole transport layer 140 disposed on the hole injection layer 130, a light-emitting layer 150 disposed on hole transport layer 140, an electron transport layer 160 disposed on light-emitting layer 150, an electron injection layer 170 disposed on electron transport layer 160, and a second electrode 180 disposed on the electron injection layer 170.

Herein, the arylamine-fluorene alternating copolymer according to the present embodiment is included in, for example, any one organic film (organic layer) disposed between the first electrode 120 and the second electrode 180. Specifically, the arylamine-fluorene alternating copolymer may be included in the hole injection layer 130 as a hole injection material, in the hole transport layer 140 as a hole transport material, or in the light-emitting layer 150 as a light-emitting material (host). The arylamine-fluorene alternating copolymer may be more desirably included in the hole injection layer 130 as a hole injection material or in the hole transport layer 140 as a hole transport material. The arylamine-fluorene alternating copolymer is particularly to be included in the hole transport layer 140 as a hole transport material. That is, in the desirable form of the present disclosure, the organic film including the arylamine-fluorene alternating copolymer may be a hole transport layer, a hole injection layer, or a light-emitting layer. In a more desirable form of the present disclosure, an organic film including the arylamine-fluorene alternating copolymer may be a hole transport layer or a hole injection layer. In a particularly desirable form of the present disclosure, an organic film including the arylamine-fluorene alternating copolymer may be a hole transport layer.

In addition, the organic film including the arylamine-fluorene alternating copolymer/EL device material may be formed by a coating method (solution coating method). Specifically, the organic film may be formed by a solution coating method such as a spin coating method, a casting method, a micro gravure coating method, a gravure coating method, a bar coating method, a roll coating method, a wire bar coating method, a dip coating method, a spray coating method, a screen printing method, a flexographic printing method, an offset printing method, an inkjet printing method, and the like.

As the solvent used in the solution coating method, any solvent may be used as long as it is capable of dissolving the arylamine-fluorene alternating copolymer/EL device material, and the solvent may be appropriately selected according to types of the arylamine-fluorene alternating copolymer. For example, the solvent may be toluene, xylene, ethyl benzene, diethylbenzene, mesitylene, propylbenzene, cyclohexylbenzene, dimethoxybenzene, anisole, ethoxytoluene, phenoxytoluene, isopropylbiphenyl, dimethylanisole, phenyl acetate, phenyl propionate, methyl benzoate, ethyl benzoate, cyclohexane, and the like. An amount of the solvent used is not particularly limited, but considering the ease of coating, a concentration of the arylamine-fluorene alternating copolymer may desirably be greater than or equal to about 0.1 mass % and less than or equal to about 10 mass %, or greater than or equal to about 0.5 mass % and less than or equal to about 5 mass %.

In addition, the film-formation method of layers other than the organic film including the arylamine-fluorene alternating copolymer/EL device material is not specifically limited. The layers other than the organic film including the arylamine-fluorene alternating copolymer according to the present embodiment/EL device material may be formed by, for example, a vacuum deposition method or may be formed by a solution coating method.

The substrate 110 may be any substrate used in a general EL device. For example, the substrate 110 may be a semiconductor substrate such as a glass substrate, a silicon substrate, and the like, or a transparent plastic substrate.

On the substrate 110, a first electrode 120 is formed. The first electrode 120 is specifically an anode, and is formed by a material having a large work function among a metal, an alloy, or a conductive compound. For example, the first electrode 120 may be formed as a transmissive electrode by indium tin oxide ($In_2O_3$—$SnO_2$: ITO), indium zinc oxide ($In_2O_3$—ZnO), tin oxide ($SnO_2$), zinc oxide (ZnO) and the like due to improved transparency and conductivity. The first electrode 120 may be formed as a reflective electrode by laminating magnesium (Mg), aluminum (Al), and the like on the transparent conductive layer. After forming the first electrode 120 on the substrate 110, washing and UV-ozone treatment may be performed as necessary.

On the first electrode 120, a hole injection layer 130 is formed. The hole injection layer 130 is a layer that facilitates injection of holes from the first electrode 120, and may be formed to have a thickness (dry film thickness; the same hereinafter) of specifically greater than or equal to about 10 nm and less than or equal to about 1000 nm, or greater than or equal to about 20 nm and less than or equal to about 50 nm.

The hole injection layer 130 may be formed of a known hole injection material. The known hole injection material of the hole injection layer 130 may include, for example, triphenylamine-containing poly(ether ketone) (TPAPEK), 4-isopropyl-4'-methyldiphenyl iodonium tetrakis(pentafluorophenyl)borate (PPBI), N,N'-diphenyl-N,N'-bis-[4-(phenyl-m-tolyl-amino)-phenyl]-biphenyl-4,4'-diamine (DNTPD), copper phthalocyanine, 4,4',4"-tris(3-methylphenylphenylamino)triphenylamine (m-MTDATA), N,N'-di(1-naphthyl)-N,N'-diphenylbenzidine (NPB), 4,4',4"-tris(diphenylamino)triphenylamine (TDATA), 4,4',4"-tris(N,N-2-naphthylphenylamino)triphenylamine (2-TNATA), polyaniline/dodecylbenzenesulphonic acid, poly(3,4-ethylenedioxythiophene)/poly(4-styrenesulfonate) (PEDOT/PSS), polyaniline/10-camphorsulfonic acid, and the like.

On the hole injection layer 130, a hole transport layer 140 is formed. The hole transport layer 140 is a layer having a function of transporting holes, and may be formed with a thickness of, for example, greater than or equal to about 10 nm and less than or equal to about 150 nm, and more specifically greater than or equal to about 20 nm and less than or equal to about 50 nm. The hole transport layer 140 may be formed by a solution coating method using the arylamine-fluorene alternating copolymer according to the present embodiment. According to this method, durability (luminescence life-span) of the EL device 100 may be extended. In addition, the current efficiency of the EL element 100 may be improved and the driving voltage may be reduced. Further, since the hole transport layer may be formed by the solution coating method, a large area film may be efficiently formed.

However, when one organic film of the EL device 100 includes the arylamine-fluorene alternating copolymer according to the present embodiment, the hole transport layer 140 may be formed of a known hole transport material. The known hole transport material may include, for example, 1,1-bis[(di-4-tolylamino) phenyl] cyclohexane (TAPC), a carbazole derivative such as N-phenylcarbazole, polyvinylcarbazole, and the like, N,N'-bis(3-methylphenyl)-N, N'-diphenyl-[1,1-biphenyl]-4,4'-diamine (TPD), 4,4',4"-tris(N-carbazolyl) triphenylamine (TCTA), and N,N'-di(1-naphthyl)-N,N'-diphenylbenzidine (NPB).

On the hole transport layer 140, a light-emitting layer 150 is formed. The light-emitting layer 150 is a layer that emits light by fluorescence, phosphorescence, and the like, and is formed using a vacuum deposition method, a spin coating method, an inkjet printing method, and the like. The light-emitting layer 150 may be formed with a thickness of, for example, about 10 nm to about 60 nm, and more specifically about 20 nm to about 50 nm. As the light-emitting material of the light-emitting layer 150 may include a known light-emitting material. However, the light-emitting material included in the light-emitting layer 150 is desirably a light-emitting material capable of emitting light (i.e., phosphorescence emission) from triplet excitons. In such a case, the driving life-span of the EL device 100 may be further improved.

The light-emitting layer 150 is not particularly limited and may have a known configuration. Desirably, the light-emitting layer may include a semiconductor nanoparticle or an organic metal complex. That is, in a desirable form of the present disclosure, the organic film has a light-emitting layer including semiconductor nanoparticles or organic metal complexes. When the light-emitting layer includes semiconductor nanoparticles, the EL device is a quantum dot electroluminescence device (QLED), a quantum dot electroluminescence device, or a quantum dot electroluminescence device. In addition, when the light-emitting layer includes an organic metal complex, the EL device is an organic electroluminescence device (OLED).

In the form in which the light-emitting layer includes semiconductor nanoparticles (QLED), the light-emitting layer may include a plurality of semiconductor nanoparticles (quantum dots) arranged in a single layer or a plurality of layers. Herein, the semiconductor nanoparticles (quantum dots) may be particles of predetermined sizes that have a quantum confinement effect. The diameter of the semiconductor nanoparticles (quantum dots) is not particularly limited but is greater than or equal to about 1 nm and less than or equal to about 10 nm.

The semiconductor nanoparticles (quantum dots) arranged in the light-emitting layer may be synthesized by a wet chemical process, an organic metal chemical deposition process, a molecular beam epitaxy process, or another similar process. Among them, the wet chemical process is a method of growing a particle by putting a precursor material in an organic solvent.

In the wet chemistry process, when crystals grow, the organic solvent naturally coordinates to the surface of the quantum dot crystals and acts as a dispersing agent, thereby controlling the growth of the crystals. For this reason, in the wet chemical process, compared with gas phase deposition methods, such as metal organic chemical vapor deposition methods (MOCVD) and molecular beam epitaxy (MBE), growth of semiconductor nanoparticles may be easily controlled at a low cost.

The semiconductor nanoparticles (quantum dots) may adjust energy bandgaps by adjusting their sizes, so that light of various wavelengths may be obtained from the light-emitting layer (quantum dot light-emitting layer). Thus, a plurality of differently sized quantum dots may embody a display that discharges (or emits) light of multiple wavelengths. The sizes of the quantum dots may be selected to emit red, green, and blue light to form a color display. In addition, the sizes of the quantum dots may be combined so that various color lights emit white light.

The semiconductor nanoparticles (quantum dots) may be semiconductor material of a Group II-VI semiconductor compound; a Group III-V semiconductor compound; a Group IV-VI semiconductor compound; a Group IV element or compound; or a combination thereof.

The Group II-VI semiconductor compound is not particularly limited, but includes, for example, a binary compound of CdSe, CdTe, ZnS, ZnSe, ZnTe, ZnO, HgS, HgSe, HgTe, or a mixture thereof; a ternary compound of CdSeS, CdSeTe, CdSTe, ZnSeS, ZnTeSe, ZnSTe, HgSeS, HgSeTe, HgSTe, CdZnS, CdZnSe, CdZnTe, CdHgS, CdHgSe, CdHgTe, HgZnS, HgZnSe, HgZnTe, or a mixture thereof, or a quaternary compound of CdZnSeS, CdZnSeTe, CdZnSTe, CdHgSeS, CdHgSeTe, CdHgSTe, HgZnSeS, HgZnSeTe, HgZnSTe, or a mixture thereof; or a combination thereof.

The Group III-V semiconductor compound is not particularly limited, but includes, for example, a binary compound of GaN, GaP, GaAs, GaSb, AlN, AlP, AlAs, AlSb, InN, InP, InAs, InSb, of a mixture thereof; a ternary compound of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, or a mixture thereof; or a quaternary compound of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a mixture thereof; or a combination thereof.

The Group IV-VI semiconductor compound is not particularly limited, but includes, for example, a binary compound of SnS, SnSe, SnTe, PbS, PbSe, PbTe, or a mixture thereof; a ternary compound of SnSeS, SnSeTe, SnSTe, PbSeS, PbSeTe, PbSTe, SnPbS, SnPbSe, SnPbTe, or a mixture thereof; or a quaternary compound SnPbSSe, SnPbSeTe, SnPbSTe, or a mixture thereof; or a combination thereof.

The Group IV element or compound is not particularly limited, but includes, for example, a single element compound of Si, Ge, or a mixture thereof; a binary compound of SiC, SiGe, or a mixture thereof; or a combination thereof.

The semiconductor nanoparticles (quantum dots) may have a homogeneous single structure or a double structure of a core-shell. The core-shell may comprise different materials. The material constituting each core and shell may be made of different semiconductor compounds. However, an energy bandgap of the shell material is larger than an energy bandgap of the core material. Specifically, structures such as ZnTeSe/ZnSe/ZnS, CdSe/ZnS, InP/ZnS, and the like are desirable.

For example, a process of producing a quantum dot having a core (CdSe).shell (ZnS) structure is described. First, crystals are formed by injecting core (CdSe) precursor materials of $(CH_3)_2Cd$ (dimethyl cadmium), TOPSe (trioctylphosphine selenide) and the like into an organic solvent using TOPO (trioctylphosphine oxide) as a surfactant. At this time, after maintaining a certain time at high temperature so that the crystals grow to a certain size, the precursor materials of the shell (ZnS) are injected, to form a shell on the surface of the core already generated. As a result, a quantum dot of CdSe/ZnS capped with TOPO may be produced.

In addition, in the form (OLED) in which the light-emitting layer includes an organic metal complex, the light-emitting layer 150 may include, for example 6,9-diphenyl-9'-(5'-phenyl-[1,1':3',1"-terphenyl]-3-yl)3,3'-bi[9H-carbazole], 3,9-diphenyl-5-(3-(4-phenyl-6-(5'-phenyl-[1,1': 3',1"-terphenyl]-3-yl)-1,3,5,-triazin-2-yl)phenyl)-9H-carbazole, 9,9'-diphenyl-3,3'-bi[9H-carbazole], tris(8-quinolinato)aluminum (Alq3), 4,4'-bis(carbazol-9-yl) biphenyl (CBP), poly(n-vinyl carbazole (PVK), 9,10-di (naphthalene)anthracene (ADN), 4,4',4"-tris(N-carbazolyl) triphenylamine (TCTA), 1,3,5-tris(N-phenyl-benzimidazol-2-yl)benzene (TPBI), 3-tert-butyl-9,10-di(naphth-2-yl) anthracene (TBADN), distyrylarylene (DSA), 4,4'-bis (9-carbazole)-2,2'-dimethyl-bipheny (dmCBP), and the like, as a host material.

In addition, the light-emitting layer 150 may include, for example, perylene and a derivative thereof, rubrene and a derivative thereof, coumarin and a derivative thereof, 4-dicyanomethylene-2-(pdimethylaminostyryl)-6-methyl-4H-pyran (DCM) and a derivative thereof, an iridium (Ir) complex such as bis[2-(4,6-difluorophenyl)pyridinate]picolinate iridium(III) (Flrpic)), bis(1-phenylisoquinoline) (acetylacetonate)iridium(III) (Ir(piq)$_2$(acac)), tris(2-phenylpyridine)iridium (III) (Ir(ppy)$_3$), tris(2-(3-p-xylyl)phenyl)pyridine iridium (III), an osmium (Os) complex, a platinum complex, and the like, as a dopant material. Among these, it is desirable that the light-emitting material is a light-emitting organic metal complex compound.

A method for forming the light-emitting layer is not particularly limited. It may be formed by coating (solution coating method) coating liquid including a semiconductor nanoparticle or an organic metal complex. At this time, it is desirable to select a solvent which does not dissolve the materials (hole transport material, particularly the arylamine-fluorene alternating copolymer) in the hole transport layer as the solvent constituting the coating liquid.

On the light-emitting layer 150, an electron transport layer 160 is formed. The electron transport layer 160 is a layer having a function of transporting electrons, and is formed using a vacuum deposition method, a spin coating method, an inkjet method, and the like. For example, the electron transport layer 160 may be formed to have a thickness of greater than or equal to about 15 nm and less than or equal to about 50 nm.

The electron transport layer 160 may be formed of a known electron transport material. The known electron transport material may include, for example, (8-quinolinato) lithium (lithium quinolate) (Liq), tris(8-quinolinato) aluminium (Alq3) and a compound having a nitrogen-containing aromatic ring. Examples of the compound having the nitrogen-containing aromatic ring may include, for example, a compound including a pyridine ring such as 1,3,5-tri[(3-pyridyl)-phen-3-yl]benzene), a compound including a triazine ring such as 2,4,6-tris(3'-(pyridin-3-yl)biphenyl-3-yl)-1, 3,5-triazine), a compound including an imidazole ring such as 2-(4-(N-phenylbenzoimidazolyl-1-yl-phenyl)-9,10-dinaphthylanthracene or 1,3,5-tris(N-phenyl-benzimidazol-2-yl)benzene: TPBI). The electron transport material may be used alone or as a mixture of two or more thereof.

On the electron transport layer 160, an electron injection layer 170 is formed. The electron injection layer 170 is a layer having a function of facilitating injection of electrons from the second electrode 180. The electron injection layer 170 is formed using a vacuum deposition method and the like. The electron injection layer 170 may be formed to have a thickness of greater than or equal to about 0.1 nm and less than or equal to about 5 nm, and more specifically, greater than or equal to about 0.3 nm and less than or equal to about 2 nm. As a material for forming the electron injection layer 170, any known material may be used. For example, the electron injection layer 170 may be formed of a lithium compound such as (8-quinolinato) lithium (lithium quinolate) (Liq) and lithium fluoride (LiF), sodium chloride (NaCl), cesium fluoride (CsF), lithium oxide (Li$_2$O), or barium oxide (BaO).

On the electron injection layer 170, a second electrode 180 is formed. The second electrode 180 is formed using a vacuum deposition method and the like. Specifically, the second electrode 180 is a cathode, and is formed by a material having a small work function among metals, alloys, or conductive compounds. For example, the second electrode 180 may be formed as a reflective electrode with a metal such as lithium (Li), magnesium (Mg), aluminum (Al), calcium (Ca), or aluminum-lithium (Al—Li), magnesium-indium (Mg—In), magnesium-silver (Mg—Ag), and the like. The second electrode 180 may be formed to have a thickness of greater than or equal to about 10 nm and less than or equal to about 200 nm, and more and specifically, greater than or equal to about 50 nm and less than or equal to about 150 nm. Alternatively, the second electrode 180 may be formed as a transmissive electrode by a thin film of less than or equal to about 20 nm of a metal material or a transparent conductive layer such as indium tin oxide (In$_2$O$_3$—SnO$_2$), and indium zinc oxide (In$_2$O$_3$—ZnO).

The EL device 100 according to the present embodiment has been described above as an example of the electroluminescence device according to the present disclosure. The organic light-emitting device 100 according to the present embodiment further improves durability (luminescence lifespan) by installing an organic film (particularly a hole transport layer or a hole injection layer) including the arylamine-fluorene alternating copolymer. In addition, luminous efficiency (current efficiency) may be further improved and a driving voltage may be reduced.

A laminate structure of the EL device 100 according to the present embodiment is not limited to the above embodiments. The EL device 100 according to the present embodiment may have another known laminate structure. For example, in the EL device 100, one or more layers of the hole injection layer 130, the hole transport layer 140, the electron transport layer 160 and the electron injection layer 170 may be omitted or another layer may be further included. In addition, each layer of the EL device 100 may be formed in a single layer or in a plurality of layers.

For example, the EL device 100 may further include a hole blocking layer between the hole transport layer 140 and the light-emitting layer 150 in order to prevent excitons or holes from diffusing into the electron transport layer 160. The hole blocking layer may be formed by, for example, an oxadiazole derivative, a triazole derivative, or a phenanthroline derivative.

In addition, the arylamine-fluorene alternating copolymer according to the present embodiment may be applied to electroluminescence devices other than the QLED or OLED. Other electroluminescence devices to which the arylamine-fluorene alternating copolymer according to the present embodiment may be applied may include, but are not particularly limited to, for example, organic inorganic perovskite light-emitting devices.

The present disclosure is described in more detail using the following examples and comparative examples. However, the technical range of the present disclosure is not limited to the following examples. In the following examples, unless specifically described, each operation is performed at room temperature (25° C.). In addition, unless specifically stated, "%" and "a part" mean "mass %" and "a part by mass", respectively.

Synthesis Example 1

(Synthesis of Compound A-1)
Compound A-1 is synthesized according to the following reaction scheme.

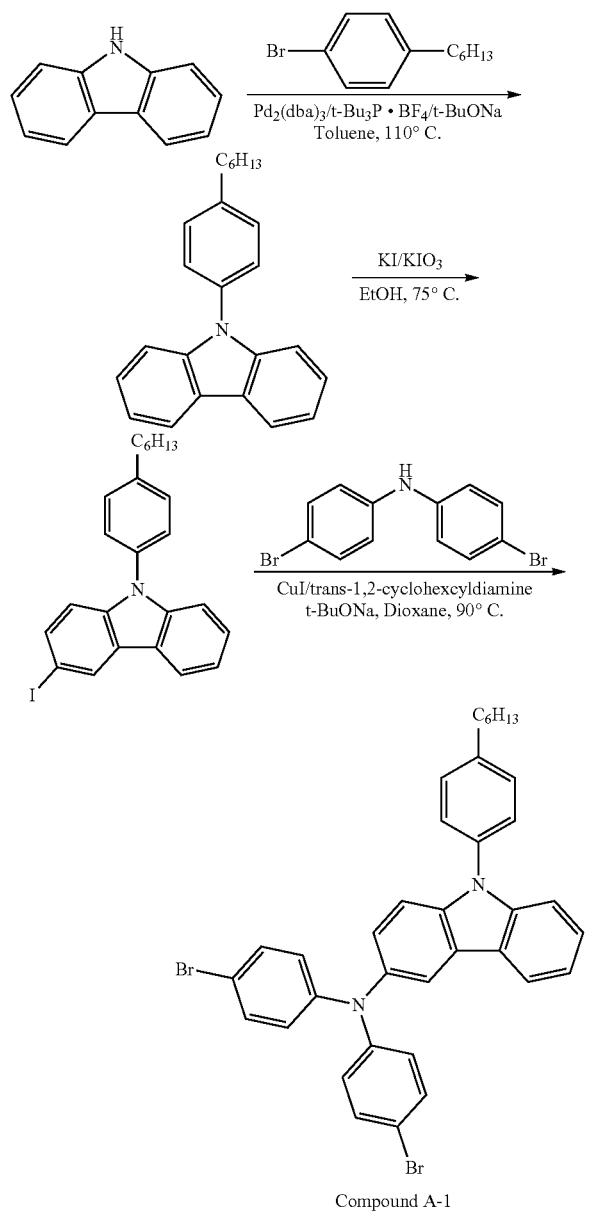

Compound A-1

In a 1 L-4-necked flask, carbazole (35.0 g), 4-bromohexylbenzene (50.2 g), tris(dibenzylideneacetone)dipalladium ($Pd_2(dba)_3$) (9.57 g), tri-tert-butylphosphonium tetrafluoroborate (t-$Bu_3$P·$BF_4$) (4.55 g), sodium t-butoxide (t-BuONa) (40.2 g), and 500 mL of toluene are added and then, heated and stirred under a nitrogen atmosphere at 100° C. for 8 hours. The flask is left cool down to room temperature (25° C., the same hereinafter), and insoluble matters are filtered therefrom with Celite (Celite: registered trademark, the same hereinafter). A filtrate therefrom is treated under a reduced pressure to distill and remove a solvent and then, purified through column chromatography to obtain 9-(4-hexylphenyl)-9-carbazole (51.4 g).

In a 1 L-four-necked flask, the obtained 9-(4-hexylphenyl)-9-carbazole (51.4 g), potassium iodide (KI) (13.02 g), potassium iodate ($KIO_3$) (16.7 g), and 525 mL of ethanol (EtOH) are added, and 98% sulfuric acid (17.1 mL) is added thereto in a dropwise fashion under a nitrogen atmosphere at room temperature and then, stirred at 75° C. for 3 hours. The flask is left cool down to room temperature, and 500 mL of toluene is added thereto and then, washed with water (100 mL×2), a 10% sodium thiosulfate aqueous solution (100 mL×2), and water (100 mL×2) and dried with magnesium sulfate. After distilling and removing a solvent therefrom under a reduced pressure, the residue is purified through column chromatography to obtain 9-(4-hexylphenyl)-3-iodine-9-carbazole (60.6 g).

In a 100 mL-3-neck flask, the obtained 9-(4-hexylphenyl)-3-iodine-9-carbazole (5.61 g), bis(4-bromophenyl)amine (4.45 g), copper iodide (CuI) (0.105 g), sodium t-butoxide (t-BuONa) (2.12 g), trans-1,2-cyclohexanediamine (0.251 g), and 28 mL of 1,4-dioxane are added and then, refluxed under a nitrogen atmosphere at 90° C. for 11 hours. Celite is used as a filter aid to filter and separate insoluble matters, and the residue is purified through column chromatography to obtain N,N-bis(4-bromophenyl)-9-(4-hexylphenyl)-9-carbazol-3-amine (Compound A-1) (1.05 g).

Synthesis Example 2

(Synthesis of Compound A-3)
Compound A-3 is synthesized according to the following reaction scheme.

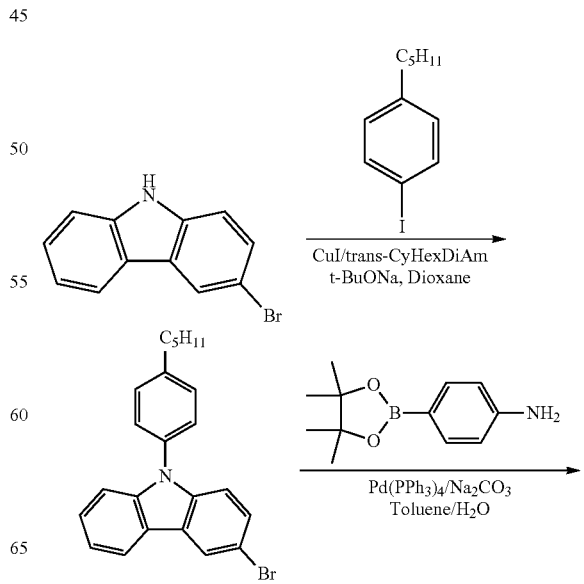

-continued

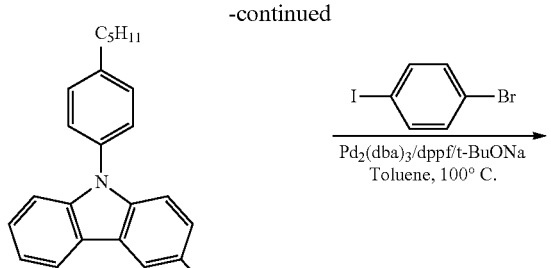

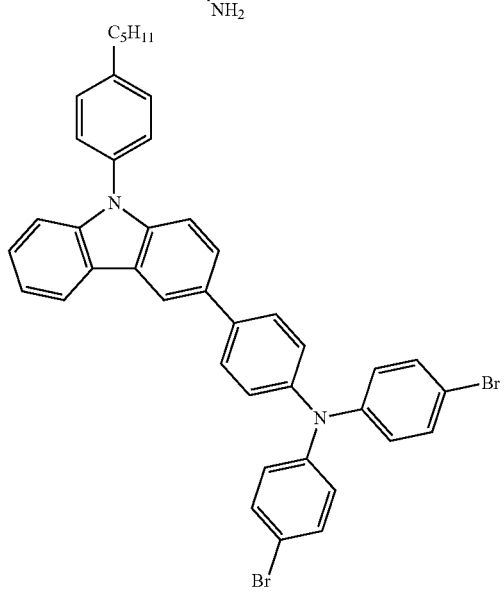

Compound A-3

3-bromo carbazole (3.5 g, 14.1 mmol), 4-iodine-1-pentyl benzene (4.6 g, 16.9 mmol), copper iodide (I) (CuI) (0.134 g, 0.7 mmol), trans-1,2-cyclohexanediamine (trans-CyHex-DiAm) (0.32 g, 2.82 mmol), sodium tert-butoxide (t-BuONa) (2.71 g, 28.2 mmol), and 50 ml of dioxane are added to a reaction vessel under argon, and the mixture is stirred at 90° C. for 5 hours. When a reaction is complete, the reaction mixture is left cool down to room temperature, and impurities are filtered therefrom by using Celite. After distilling and removing a solvent therefrom, the residue is purified through column chromatography to obtain 3-bromo-9-pentyl phenyl-9-carbazole (4.5 g).

In a reaction vessel under argon, the obtained 3-bromo-9-pentyl phenyl-9-carbazole (4.5 g, 11.5 mmol), 4-(4,4,5,5-tetramethyl-1,3,2-dioxaborolane-2-yl)aniline (2.6 g, 12.0 mmol), tetrakis(triphenylphosphine)palladium (0) (Pd (PPh$_3$)$_4$) (0.39 g, 0.345 mmol), sodium carbonate (2.4 g, 23.0 mmol), 100 ml of toluene, and 50 ml of water are added, and then, the mixture is stirred at 85° C. 10 hours. When a reaction is complete, the reaction mixture is left cool down to room temperature, and impurities are filtered therefrom by using Celite. After distilling and removing a solvent therefrom, the residue is purified through column chromatography to obtain 4-(9-4-(pentylphenyl)-9-carbazol-3-yl) aniline (4.0 g).

In a four-necked flask substituted with argon, the obtained 4-(9-4-(pentylphenyl)-9-carbazol-3-yl)aniline (4.0 g, 9.9 mmol), 4-bromo-iodinebenzene (2.8 g, 10.0 mmol), tris (dibenzylideneacetone)dipalladium (Pd$_2$(dba)$_3$) (0.091 g), 1,1'-bis(diphenylphosphino)ferrocene (dppf) (0.11 g), sodium tert-butoxide (t-BuONa) (0.95 g, 9.9 mmol), and 100 mL of toluene are added and then, heated at 100° C. for 20 hours. The resulting mixture is left cool down to room temperature, and impurities are filtered therefrom by using Celite. After distilling and removing a solvent therefrom under a reduced pressure, the residue is purified through column chromatography to obtain Compound A-3 (1.7 g).

Synthesis Example 3

(Synthesis of Compound A-4)

Compound A-4 is synthesized according to the following reaction scheme.

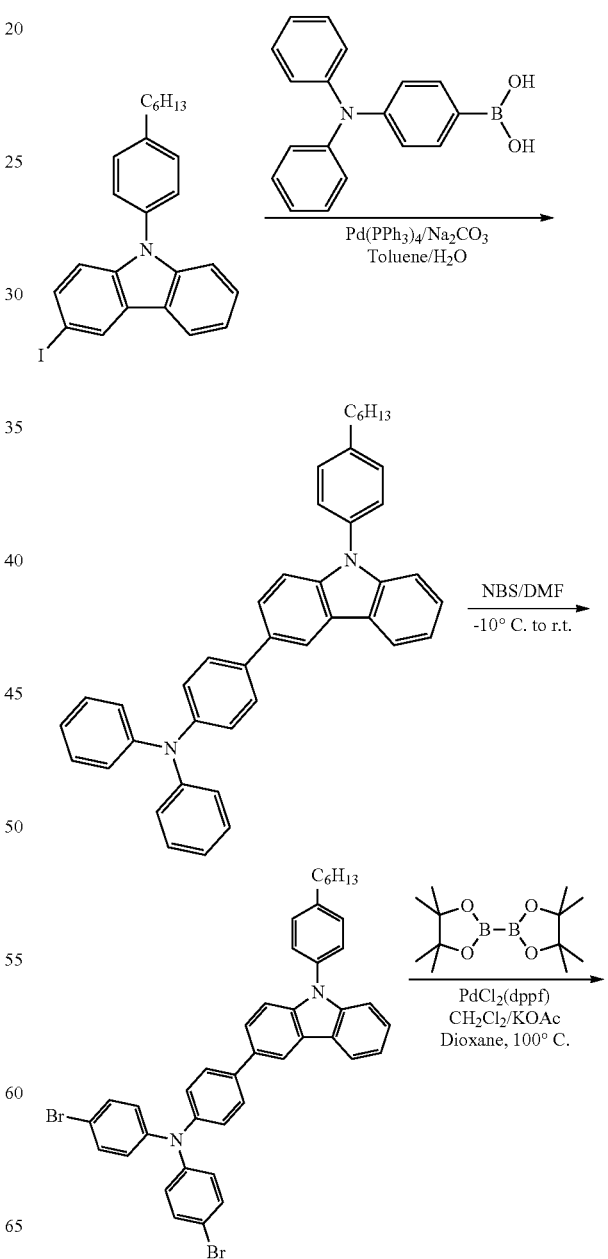

-continued

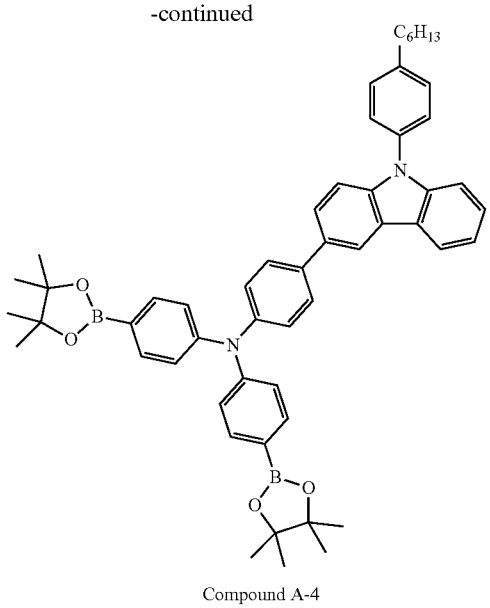

Compound A-4

In a 1 L-four-necked flask, 9-(4-hexylphenyl)-3-iodine-9-carbazole (20.0 g), 4-(diphenyl amino)phenylboronic acid (15.3 g), sodium carbonate (9.51 g), tetrakis(triphenylphosphine)palladium (0) (Pd(PPh$_3$)$_4$) (2.49 g), 221 mL of toluene, 110 mL of ethanol, and 110 mL of water are added and then, stirred at 120° C. (a bath temperature) for 3 hours. The resulting mixture is left cool down to room temperature, and after separating a water layer therefrom, an organic layer is washed with water (100 L×2) and dried with magnesium sulfate. After distilling and removing a solvent therefrom under a reduced pressure, the residue is purified through column chromatography to obtain 4-(9-(4-hexylphenyl)-9-carbazol-3-yl)-N,N-diphenyl)aniline (17.7 g).

In a 500 mL-four-necked flask, the obtained 4-(9-(4-hexylphenyl)-9-carbazol-3-yl)-N,N-diphenyl)aniline (17.7 g), and 310 mL of N,N-dimethyl formamide (DMF) are added and then, cooled in ice, and N-bromo succinimide (NBS) (11.7 g) dissolved in DMF (30 mL) is added thereto in a dropwise fashion under a nitrogen atmosphere and then, stirred for 6 hours. After separating and filtering insoluble matters therefrom, the residue is washed with 800 mL of methanol and 800 mL of water and vacuum-dried to obtain 4-bromo-N-(4-bromophenyl)-N-(4-(9-(4-hexylphenyl)-9-carbazol-3-yl)phenyl)aniline (14.0 g).

In a 500 mL-four-necked flask, the obtained 4-bromo-N-(4-bromophenyl)-N-(4-(9-(4-hexylphenyl)-9-carbazol-3-yl)phenyl)aniline (14.0 g), bispinacolato diborate (14.8 g), potassium acetate (KOAc) (11.4 g), [1,1'-bis(diphenylphosphino)ferrocene]palladium(II) dichloride dichloromethane adduct (PdCl$_2$(dppf)CH$_2$Cl$_2$) (0.477 g), and 160 mL of 1,4-dioxane are added and then, refluxed under a nitrogen atmosphere at 100° C. for 4 hours. The reaction solution is cooled down to room temperature and then, filtered and separated by using Celite as a filter aid to filter a solid, and a filtrate therefrom is passed through silica gel. After distilling and removing a solvent therefrom under a reduced pressure, the residue is dissolved in 200 mL of toluene, and activated carbon (14.2 g) is added thereto and then, refluxed for 30 minutes. After filtering and separating the activated carbon therefrom and distilling and removing a solvent therefrom under a reduced pressure, the obtained residue is recrystallized by using a mixed solvent of toluene and acetonitrile to obtain Compound A-4 (11.9 g).

Synthesis Example 4

(Synthesis of Compound A-5)

Compound A-5 is synthesized according to the following reaction scheme.

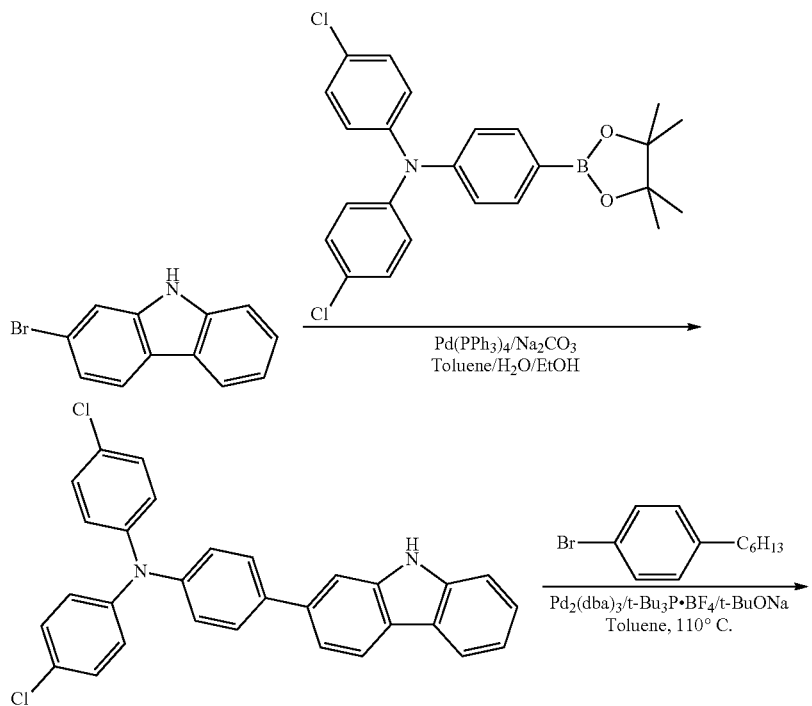

-continued

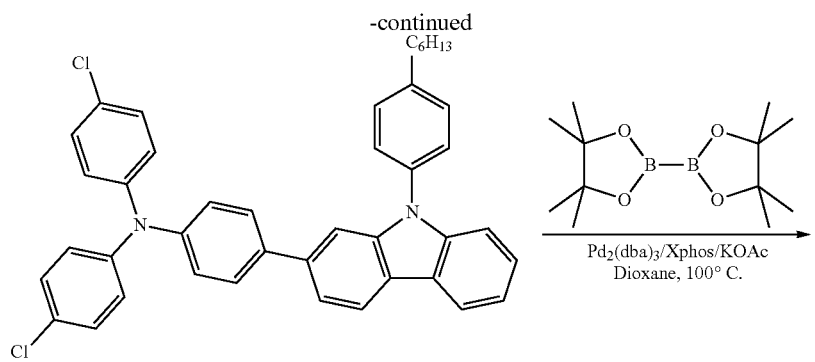

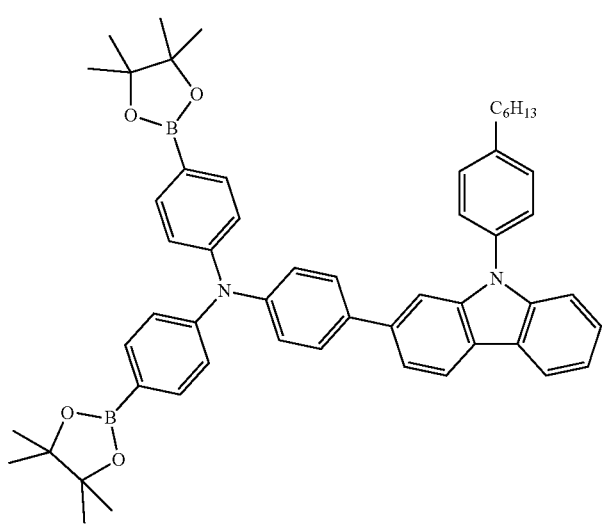

Compound A-5

In a 100 mL-four-necked flask, 2-bromo carbazole (20.0 g), 4-chloro-N-(4-chlorophenyl)-N-(4-(4,4,5,5-tetramethyl-1,3,2-dioxaborane-2-yl)phenyl)aniline (10.0 g), sodium carbonate (4.84 g), tetrakis(triphenylphosphine)palladium (0) (Pd(PPh$_3$)$_4$) (1.31 g), 80 mL of toluene, 30 mL of ethanol, and 30 mL of water are added and then, stirred at 100° C. (a bath temperature) for 3 hours. The resulting mixture is cooled down to room temperature, and after separating a water layer therefrom, an organic layer is washed with water (100 L×2) and dried with magnesium sulfate. After distilling and removing a solvent therefrom under a reduced pressure, 200 mL of toluene is added to the residue and then, refluxed at 60° C. for 1 hour, and a solid is filtered and separated therefrom and dried to obtain N-(4-(9-carbazol-2-yl)phenyl)-4-chloro-N-(4-chlorophenyl)aniline (6.08 g).

In a four-necked flask substituted with argon, the obtained N-(4-(9-carbazol-2-yl)phenyl)-4-chloro-N-(4-chlorophenyl)aniline (6.00 g), 1-bromo-4-hexylbenzene (3.00 g), tris(dibenzylideneacetone)dipalladium (Pd$_2$(dba)$_3$) (0.580 g), tri-tert-butylphosphonium tetrafluoroborate (t-Bu$_3$P.BF$_3$) (0.276 g), sodium tert-butoxide (t-BuONa) (2.43 g), and 60 mL of toluene are added and then, heated at 110° C. for 7 hours. The resulting mixture is cooled down to room temperature, and Celite is used to filter impurities. After distilling and removing a solvent therefrom under a reduced pressure, the residue is purified through column chromatography to obtain 4-chloro-N-(4-chlorophenyl)-N-(4-(9-(4-hexylphenyl)-9-carbazol-2-yl)phenyl)aniline (1.60 g). In a 50 mL-3-neck flask, the obtained 4-chloro-N-(4-chlorophenyl)-N-(4-(9-(4-hexylphenyl)-9-carbazol-2-yl)phenyl)aniline (1.60 g), bispinacol diborate (1.90 g), potassium acetate (KOAc) (1.47 g), tris(dibenzylideneacetone)dipalladium (Pd$_2$(dba)$_3$) (0.114 g), Xphos (0.177 g), and 1,4-dioxane (16 mL) are added and then, stirred under a nitrogen atmosphere at a bath temperature of 100° C. for 3 hours. The resulting mixture is cooled down to room temperature, and Celite as a filter aid is used to remove insoluble matters. After distilling and removing a solvent therefrom under a reduced pressure, the residue is dissolved in a mixed solvent of 20 mL of toluene and 40 mL of hexane, and activated carbon (2.0 g) is added thereto and then, refluxed for 30 minutes. Celite is used as a filter aid to filter and separate insoluble matters therefrom, and after distilling and removing a solvent therefrom under a reduced pressure, the residue is recrystallized in toluene/acetonitrile to obtain Compound A-5 (1.85 g).

Synthesis Example 5

(Synthesis of Compound B-3)
Compound B-3 is synthesized according to the following reaction scheme.

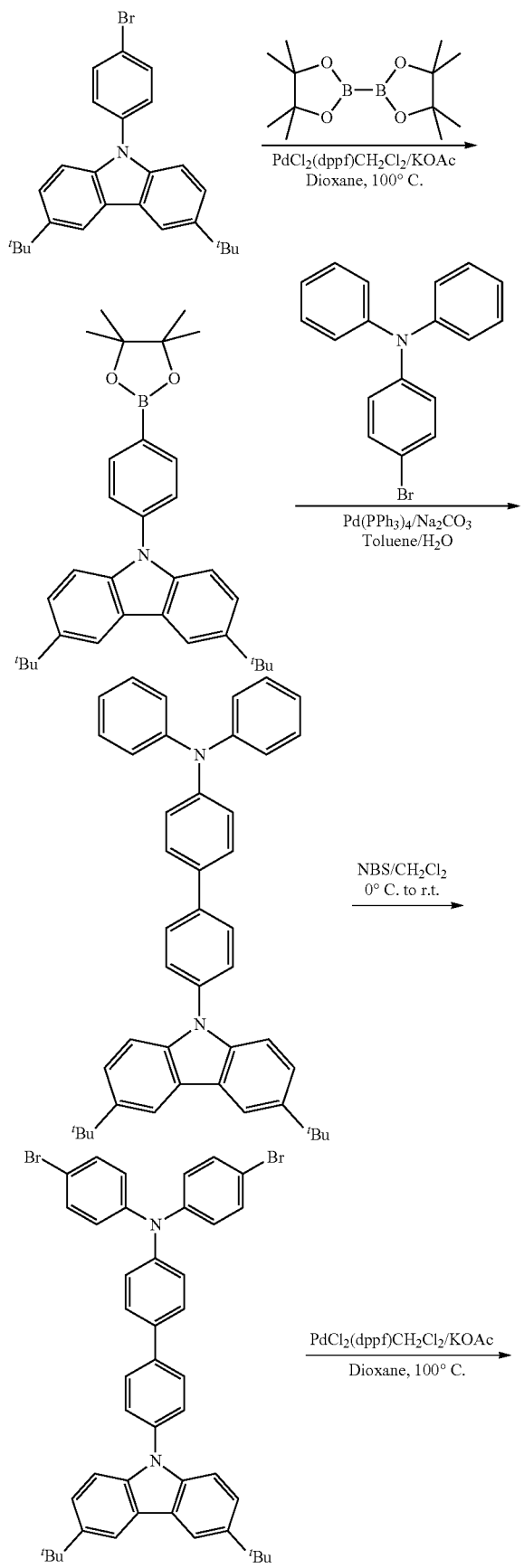

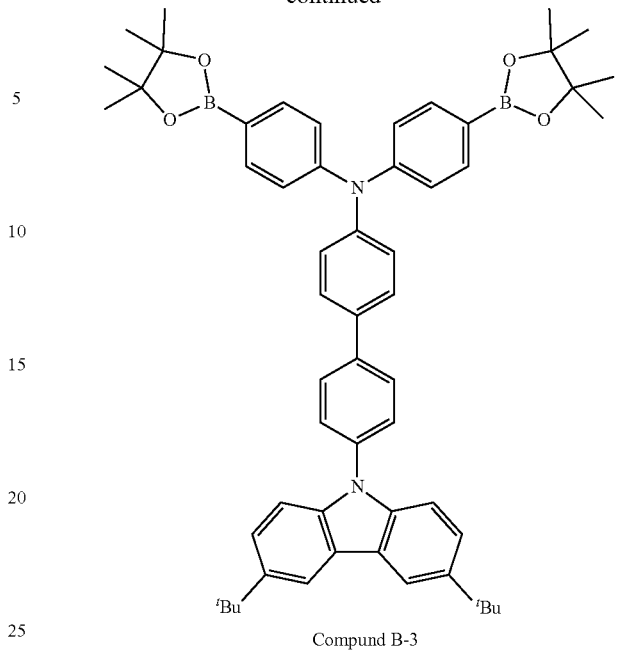

Compund B-3

In a 500 mL-3-neck flask, 9-(4-bromophenyl)-3,6-di-tert-butyl carbazole (15.0 g), bispinacoldiborate (15.7 g), potassium acetate (KOAc) (12.1 g), [1,1'-bis(diphenylphosphino)ferrocene]palladium(II) dichloride dichloromethane adduct ($PdCl_2$(dppf)$CH_2Cl_2$) (0.504 g), and 170 mL of 1,4-dioxane are added and then, stirred under a nitrogen atmosphere at a bath temperature of 100° C. for 6 hours. The resulting mixture is cooled down to room temperature, and Celite is used as a filter aid to remove insoluble matters. After distilling and removing a solvent under a reduced pressure, the residue is dissolved in 170 mL of toluene, and 17 g of activated carbon is added thereto and then, refluxed for 30 minutes. Celite is used as a filter aid to filter and separate insoluble matters, and after distilling and removing a solvent therefrom under a reduced pressure, the residue is recrystallized with toluene/ethanol to obtain 3,6-di-tert-butyl-9-(4-(4,4,5,5-tetramethyl-1,3,2-dioxaborane-2-yl)phenyl)-9-carbazole (16.0 g).

In a 500 mL-3-neck flask, the obtained 3,6-di-tert-butyl-9-(4-(4,4,5,5-tetramethyl-1,3,2-dioxaborane-2-yl)phenyl)-9-carbazole (15.7 g), 4-bromo triphenylamine (9.00 g), sodium carbonate, tetrakis(triphenylphosphine)palladium (0) (Pd(PPh$_3$)$_4$) (1.60 g), 140 mL of toluene, 70 mL of ethanol, and 70 mL of water are added and then, stirred under a nitrogen atmosphere at a bath temperature of 100° C. for 3 hours. The resulting mixture is cooled down to room temperature, and after separating an organic layer therefrom, a water layer is extracted with toluene (50 mL×3). The organic layer is combined therewith and then, washed with water (50 mL×3) and dried with magnesium sulfate. After distilling and removing a solvent under a reduced pressure, the residue is dissolved in 150 mL of tetrahydrofuran (THF), and 16 g of activated carbon is added thereto and then, refluxed for 30 minutes. The activated carbon is filtered and separated by using Celite as a filter aid, and a solvent is distilled and removed under a reduced pressure. 100 mL of ethanol is added to the obtained solid and then, refluxed for 30 minutes, and the solid is filtered and separated and then, dried to obtain 4'-(3,6-di-tert-butyl-9-carbazol-9-yl)-N,N-diphenyl-[1,1'-biphenyl]-4-amine (8.34 g).

In a 300 mL-four-necked flask, the obtained 4'-(3,6-di-tert-butyl-9-carbazol-9-yl)-N,N-diphenyl-[1,1'-biphenyl]-4-amine (8.30 g) and 150 mL of dichloromethane are added, and N-bromo succinimide (NBS) (0.762 g) dissolved in 15 mL of dichloromethane under a nitrogen atmosphere at 0° C. in advance is added thereto in a dropwise fashion and then, stirred for 3 hours. A solid precipitated therein is filtered, washed with methanol, and recrystallized with toluene/acetonitrile to obtain N,N-bis(4-bromophenyl)-4'-(3,6-di-tert-butyl-9-carbazol-9-yl)-[1,1'-biphenyl]-4-amine (5.40 g).

In a 200 mL-3-neck flask, the obtained N,N-bis(4-bromophenyl)-4'-(3,6-di-tert-butyl-9-carbazol-9-yl)-[1,1'-biphenyl]-4-amine (5.30 g), bispinacoldiborate (7.24 g), potassium acetate (KOAc) (4.20 g), [1,1'-bis(diphenyl phosphino)ferrocene]palladium(II) dichloride dichloromethane adduct (PdCl$_2$(dppf)CH$_2$Cl$_2$) (0.303 g), and 60 mL of 1,4-dioxane are added and then, stirred under a nitrogen atmosphere at a bath temperature of 100° C. for 3 hours. The resulting mixture is cooled down to room temperature, and Celite is used as a filter aid to remove insoluble matters. After distilling and removing a solvent under a reduced pressure, the residue is dissolved in 170 mL of toluene, and 6 g of activated carbon is added thereto and then, refluxed for 30 minutes. Celite is used as a filter aid to filter and separate insoluble matters, and after distilling and removing a solvent under a reduced pressure, the residue is recrystallized in toluene/acetonitrile to obtain Compound B-3 (3.20 g).

Synthesis Example 6

(Synthesis of Compound B-4)

Compound B-4 is synthesized according to the following reaction scheme.

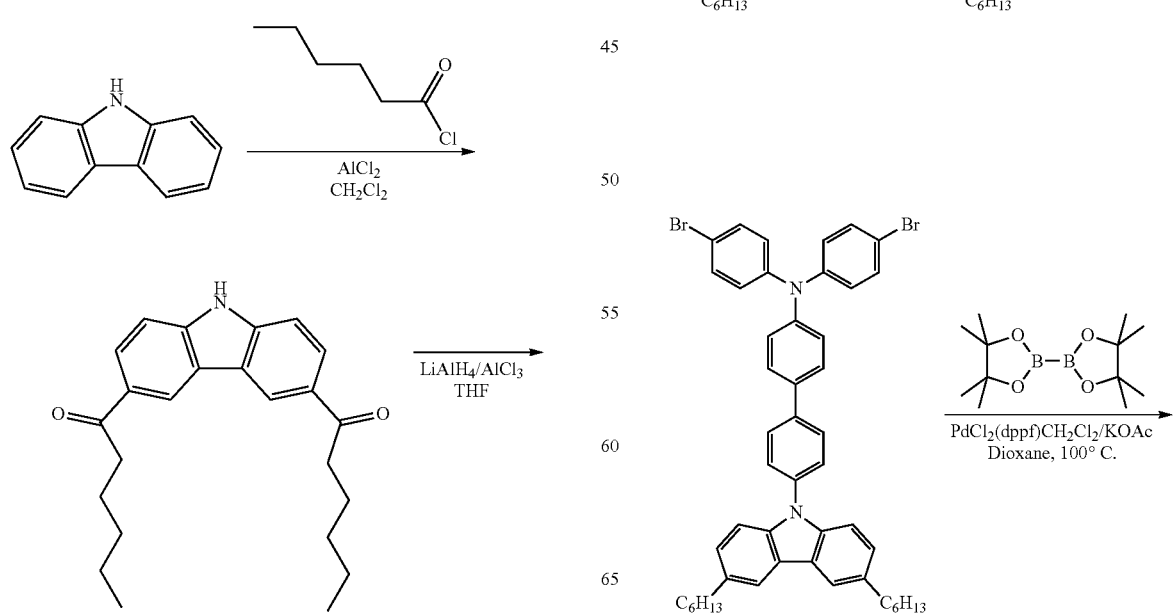

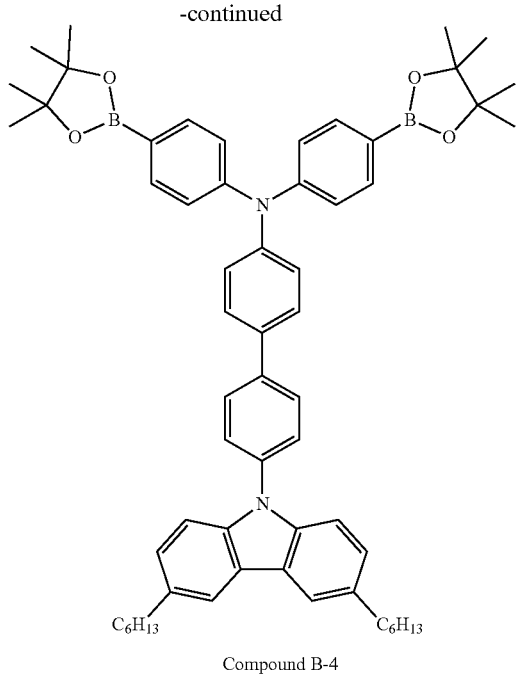

Compound B-4

In a 2 L-3-neck flask, aluminum chloride (43.9 g) and 500 mL of dichloromethane are added and then, cooled down to 0° C. under a nitrogen atmosphere, and then, hexanoyl chloride (46.3 g) is added thereto in a dropwise fashion, and subsequently, 300 mL of a dichloromethane solution of carbazole (25.0 g) is added thereto in a dropwise fashion. When the addition is complete, the mixture is stirred at room temperature for 12 hours. When a reaction is complete, the resulting mixture is cooled down to 0° C., and a sodium potassium tartrate aqueous solution (90.0 g, 300 mL) is added thereto in a dropwise fashion and then, stirred at room temperature for 1 hour. Subsequently, ethyl acetate is added thereto, an organic layer therefrom is washed with water and dried with sodium sulfate, and a solvent is distilled and removed therefrom under a reduced pressure. The residue is purified using column chromatography to obtain 1,1-(9H-carbazol-3,6-diyl)bis(hexan-1-one) (43.0 g).

In a 2 L-3-neck flask, aluminum chloride (16.9 g) and 180 mL of tetrahydrofuran (THF) are added and then, cooled down to 0° C. under a nitrogen atmosphere, and lithium aluminum hydride (LiAlH₄) (a 10% tetrahydrofuran solution, 100 mL) is added thereto in a dropwise fashion. Subsequently, 240 mL of a tetrahydrofuran solution of the obtained 1,1-(9H-carbazol-3,6-diyl)bis(hexan-1-one) (23.0 g) is added thereto in a dropwise fashion and then, stirred at 0° C. under a nitrogen atmosphere for 30 minutes and stirred at room temperature for 10 hours. When a reaction is complete, the resulting mixture is cooled down to 0° C., and a sodium.potassium tartrate aqueous solution (107.0 g, 360 mL) is added thereto and then, stirred at room temperature for 1 hour. Subsequently, ethyl acetate is added thereto, an organic layer therefrom is washed with water and dried with sodium sulfate, and a solvent is distilled and removed under a reduced pressure. The residue is purified using column chromatography to obtain 3,6-dihexyl-9H-carbazole (16.2 g).

In a 500 mL-3-neck flask, the obtained 3,6-dihexyl-9H-carbazole (9.0 g), N-(4-chloro-(1,1-biphenyl)-N,N-diphenylamine (8.64 g), sodium t-butoxide (t-BuONa) (4.86 g), trisdibenzylideneacetonedipalladium (Pd₂(dba)₃) (0.463 g), 2-dicyclohexylphosphino-2',4', 6'-triisopropylbiphenyl (Xphos) (0.482 g), and 127 mL of toluene are added and then, stirred under a nitrogen atmosphere at a bath temperature of 110° C. for 6 hours. The resulting mixture is cooled down to room temperature, and Celite is used as a filter aid to remove insoluble matters. After distilling and removing a solvent under a reduced pressure, the residue is dissolved in 150 mL of toluene, and activated carbon (1.0 g) is added thereto and then, refluxed for 30 minutes. Celite is used as a filter aid to filter and separate insoluble matters, and after distilling and removing a solvent under a reduced pressure, the residue is purified through column chromatography to obtain 4'-(3,6-dihexyl-9H-carbazol-9-yl)-N,N-diphenyl-[1,1'-biphenyl]-4-amine (14.6 g).

In a 200 mL-four-necked flask, the obtained 4'-(3,6-dihexyl-9H-carbazol-9-yl)-N,N-diphenyl-[1,1'-biphenyl]-4-amine (11.0 g) and 60 mL of dimethyl formamide are added, and N-bromo succinimide (NBS) (5.98 g) dissolved in 25 mL of dimethyl formamide (DMF) under a nitrogen atmosphere at 0° C. in advance is added thereto and then, stirred for 3 hours. Subsequently, ethyl acetate is added thereto, and an organic layer therefrom is washed with water and dried with sodium sulfate and then, concentrated through distillation and removal under a reduced pressure. The concentrated solution is added to methanol in a dropwise fashion, and a solid precipitated therein is filtered and separated to obtain 4'-(3,6-diphenyl-9H-carbazol-9-yl)-N,N-diphenyl-[1,1'-biphenyl]-4-amine (12.6 g).

In a 500 mL-3-neck flask, the obtained 4'-(3,6-diphenyl-9H-carbazol-9-yl)-N,N-diphenyl-[1,1'-biphenyl]-4-amine (12.6 g), bispinacoldiborate (11.8 g), potassium acetate (KOAc) (9.13 g), [1,1'-bis(diphenylphosphino)ferrocene]palladium(II)dichloride (PdCl₂(dppf)CH₂Cl₂) (0.380 g), and 160 mL of 1,4-dioxane are added and then, stirred under a nitrogen atmosphere at a bath temperature of 100° C. for 5 hours. The resulting mixture is cooled down to room temperature, and Celite as a filter aid is used to remove insoluble matters. After distilling and removing a solvent under a reduced pressure, the residue is dissolved in 200 mL of toluene, and insoluble matters are removed therefrom using a silica gel (150 g) short column. After distilling and removing a solvent therefrom under a reduced pressure, the residue is recrystallized with toluene/acetonitrile to obtain Compound B-4 (11.0 g).

Comparison Synthesis Example 1

(Synthesis of Compound A-2)

Compound A-2 is synthesized according to the following reaction scheme.

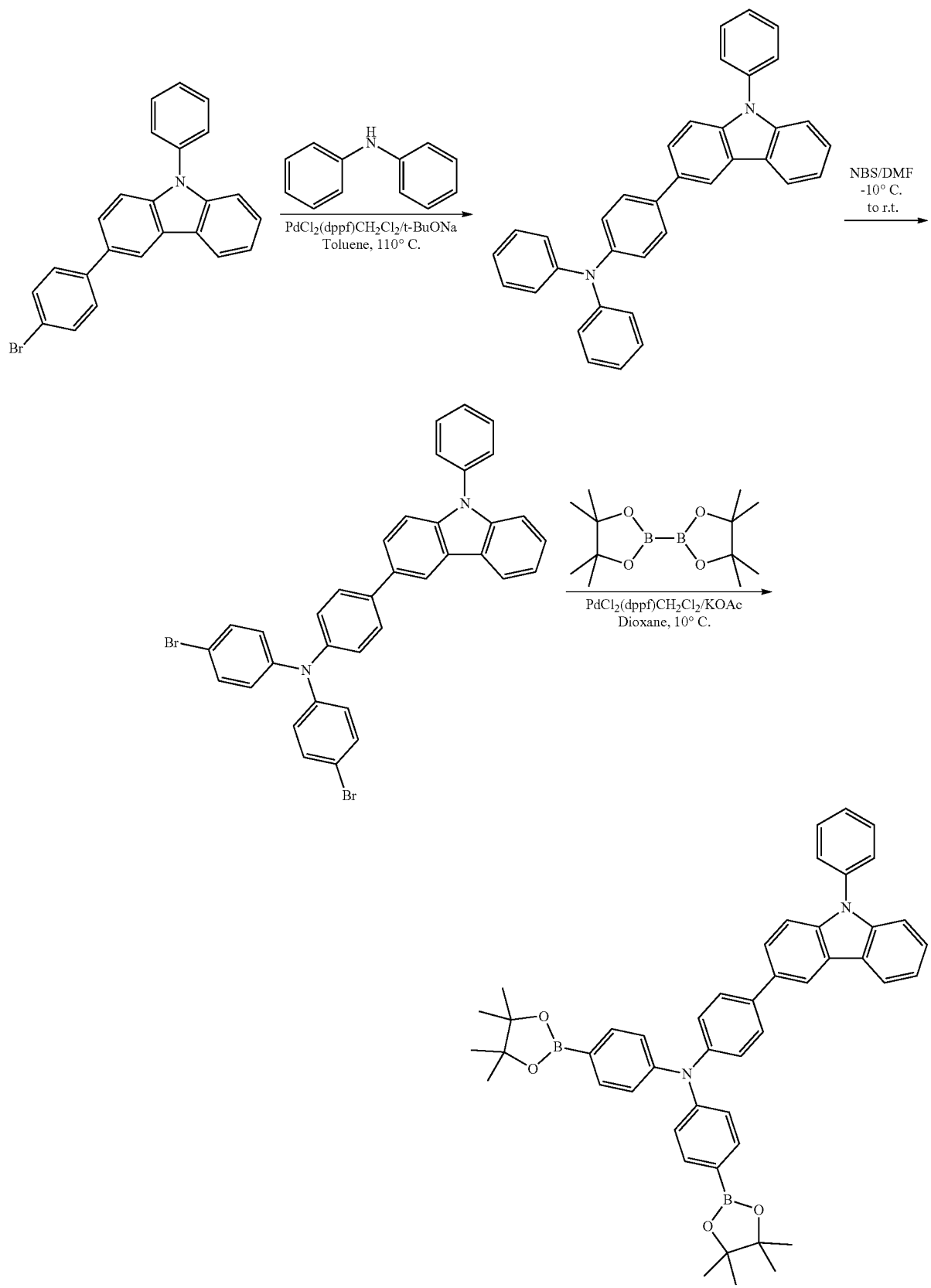

In a 200 mL-four-necked flask, 3-(4-bromophenyl)-9-phenyl carbazole (21.0 g), diphenyl amine (8.91 g), sodium t-butoxide (10.0 g), [1,1'-bis(diphenyl phosphino)ferrocene] palladium(II) dichloride dichloromethane adduct (PdCl$_2$(dppf)CH$_2$Cl$_2$) (2.14 g), and 75 mL of toluene are added and then, refluxed under a nitrogen atmosphere at 110° C. for 3 hours. Celite is used as a filter aid to filter and separate insoluble matters therefrom, the residue is passed through silica gel, and 25 g of activated carbon is added thereto and then, refluxed for 30 minutes. Celite is used as a filter aid to filter and separate the activated carbon, and a solvent is distilled and removed therefrom under a reduced pressure. The obtained solid is recrystallized by using toluene and acetonitrile to obtain N,N-diphenyl-4-(9-phenyl-9-carbazol-3-yl)amine (19.9 g).

In a 500 mL-four-necked flask, the obtained N,N-diphenyl-4-(9-phenyl-9-carbazol-3-yl)amine (17.7 g) and 310 mL of DMF are added and then, cooled down with ice, and N-bromo succinimide (NBS) (11.7 g) dissolved in 30 mL of DMF under a nitrogen atmosphere is added thereto in a dropwise fashion and then, stirred for 6 hours. After filtering and separating insoluble matters therefrom, the residue is washed with 800 mL of methanol and 800 mL of water and vacuum-dried to obtain N,N-bis(4-bromophenyl)-4-(9-phenyl-9-carbazol-3-yl)amine (14.0 g).

In a 200 mL-four-necked flask, the obtained N,N-bis(4-bromophenyl)-4-(9-phenyl-9-carbazol-3-yl)amine (8.00 g), potassium acetate (KOAc) (7.31 g), [1,1'-bis(diphenyl phosphino)ferrocene]palladium(II) dichloride dichloromethane adduct (PdCl$_2$(dppf)CH$_2$Cl$_2$) (0.304 g), and 1,4-dioxane (100 mL) are added and then, refluxed under a nitrogen atmosphere at 100° C. for 4 hours. The reaction solution is cooled down to room temperature, and Celite is used as a filter aid to separate and filter a solid, and the solid is passed through silica gel. After distilling and removing a solvent under a reduced pressure, the residue is dissolved in 100 mL of toluene and 150 mL of hexane, and activated carbon (8.0 g) is added thereto and then, refluxed for 30 minutes. After separating and filtering the activated carbon and then, distilling and removing a solvent under a reduced pressure, the residue is recrystallized with a mixed solvent of toluene and acetonitrile to obtain Compound A-2 (6.29 g).

Comparative Synthesis Example 2

(Synthesis of Compound B-1)
Compound B-1 is synthesized according to the following reaction.

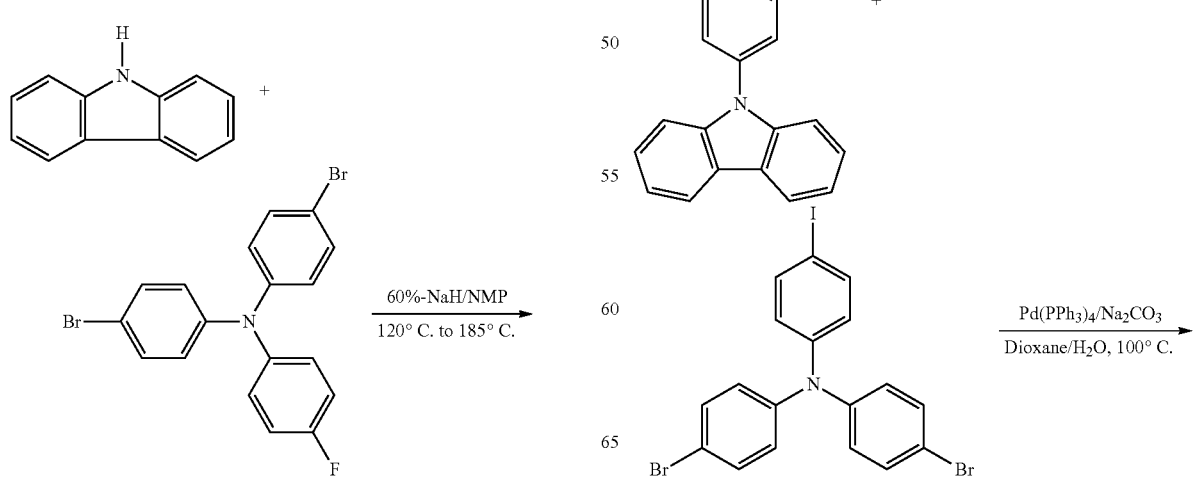

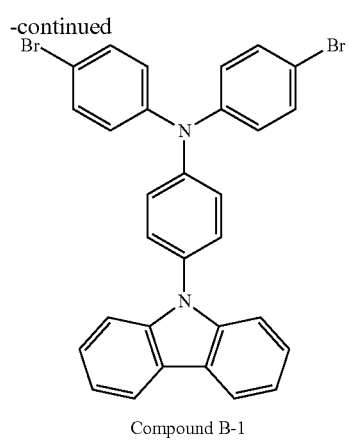

Compound B-1

In a 500 mL-3-neck flask, carbazole (2.93 g), 4,4'-dibromo-4"-fluoro triphenylamine (7.58 g), and 175 mL of 1-methyl-2-pyrrolidone (NMP) are added and then, heated under a nitrogen atmosphere at a bath temperature of 120° C., and sodium hydride (0.329 g) is added thereto and then, stirred for 1 hour. The resulting mixture is heated up to 185° C., and sodium hydride (0.329 g) is added thereto and then, stirred for 6 hours. The resulting mixture is slowly cooled down to room temperature, and 175 mL of toluene and 90 mL of methanol are added thereto. The resulting mixture is washed with water (200 mL×3) and dried with magnesium sulfate, and a solvent is distilled and removed therefrom under a reduced pressure. The residue is purified using column chromatography to obtain Compound B-1 (1.26 g).

Comparative Synthesis Example 3

(Synthesis of Compound B-2)
Compound B-2 is synthesized according to the following reaction scheme.

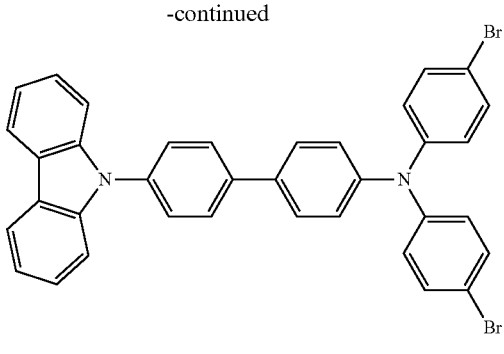

Compound B-2

In a 500 mL-3-neck flask, 9-[4-(4,4,5,5-tetramethyl-1,3,2-dioxaborolane-2-yl)phenyl]-9H-carbazole (5.34 g), 4,4'-dibromo-4"-iodine triphenylamine (7.50 g), carbonate sodium (2.69 g), tetrakis(triphenylphosphine)palladium (0) (Pd(PPh$_3$)$_4$) (0.74 g), 125 mL of 1,4-dioxane, and 63 mL of water are added and then, stirred under a nitrogen atmosphere at a bath temperature of 100° C. for 3 hours. The resulting mixture is cooled down to room temperature, and 125 mL of toluene is added thereto and then, washed with water (50 mL×3) and dried with magnesium sulfate. After distilling and removing a solvent under a reduced pressure, the residue is dissolved in 50 mL of toluene and 100 mL of hexane, and 8 g of activated carbon is added thereto and then, refluxed for 30 minutes. The residue is cooled down to room temperature, Celite is used as a filter aid to remove the activated carbon, and a solvent is distilled and removed therefrom under a reduced pressure. The residue is recrystallized (toluene/acetone) to obtain Compound B-2 (6.38 g).

Example 1

Under an argon atmosphere, Compound A-1 (1.48 g) according to Synthesis Example 1, 2,7-bis(4,4,5,5-tetramethyl-1,3,2-dioxaborolane-2-)-9,9-di-n-octyl fluorene (1.45 g), palladium acetate (10.2 mg), tris(2-methoxy phenyl) phosphine (48.0 mg), 60 mL of toluene, and a 20 mass % tetraethyl ammonium hydroxide aqueous solution (11.7 g) are added in a four-necked flask and then, stirred at 85° C. for 6 hours. Subsequently, 121 mg of phenylboronic acid, 159 mg of tetrakis(triphenylphosphino)palladium, and a 20 mass % tetraethylammonium hydroxide aqueous solution (11.7 g) are added thereto and then, stirred for 3 hours. Then, sodium N,N-diethyldithiocarbamate trihydrate (5.92 g) dissolved in 50 mL of ion exchange water is added thereto and then, stirred at 85° C. for 2 hours. An organic layer is separated from a water layer and then, washed with water, a 3 mass % acetic acid aqueous solution, and water. The organic layer is treated through column chromatography charged with silica gel/alumina, and a solvent is distilled and removed therefrom under a reduced pressure. The obtained liquid is added to methanol in a dropwise fashion, and a solid precipitated therein is dissolved in toluene. Subsequently, this solution is added to methanol in a dropwise fashion, and a solid precipitated therein is filtered and dried to obtain Polymer Compound P-1 (1.19 g). A weight average molecular weight (Mw) and polydispersity (Mw/Mn) of Polymer Compound P-1 are measured with SEC. As a result, the weight average molecular weight (Mw) and polydispersity (Mw/Mn) of Polymer Compound P-1 are 240,000 and 5.20 respectively.

Polymer Compound P-1 obtained in this way is estimated to be a polymer compound having the following structural units from a content ratio of the monomers.

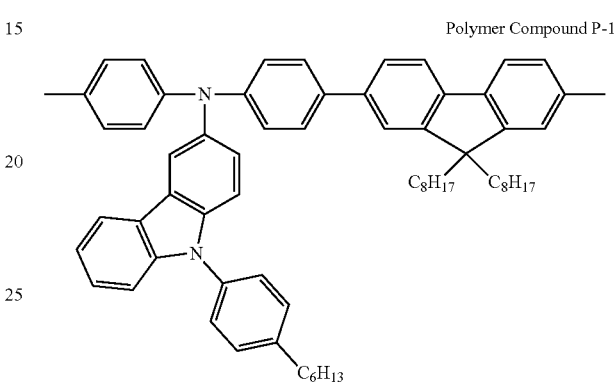

Polymer Compound P-1

Example 2

Under an argon atmosphere, Compound A-3 (1.01 g) according to Synthesis Example 2, 2,7-bis(4,4,5,5-tetramethyl-1,3,2-dioxaborolane-2-)-9,9-di-n-octylfluorene (0.971 g), palladium acetate (2.15 mg), tris(2-methoxy phenyl) phosphine (20.3 mg), 40 mL of toluene, and a 20 mass % tetraethylammonium hydroxide aqueous solution (7.61 g) are added in a four-necked flask and then, stirred at 85° C. for 7 hours. Subsequently, sodium N,N-diethyldithiocarbamate trihydrate (6.86 g) dissolved in 40 mL of ion exchange water is added thereto and then, stirred at 85° C. for 2 hours. An organic layer is separated from a water layer and then, washed with water, a 3 mass % acetic acid aqueous solution, and water. The organic layer is passed through a column charged with silica gel/alumina, and a solvent is distilled and removed therefrom under a reduced pressure. The obtained liquid is added to methanol in a dropwise fashion, and a solid precipitated therein is dissolved in toluene. Subsequently, this solution is added to methanol in a dropwise fashion, and a solid precipitated therein is filtered and dried to obtain Polymer Compound P-2 (0.92 g). A weight average molecular weight (Mw) and polydispersity (Mw/Mn) of Polymer Compound P-2 are measured with SEC. As a result, the weight average molecular weight (Mw) and polydispersity (Mw/Mn) of Polymer Compound P-2 are respectively 91,600 and 2.50.

Polymer Compound P-2 obtained in this way is estimated to be a polymer compound having the following structural units from a content ratio of the monomers.

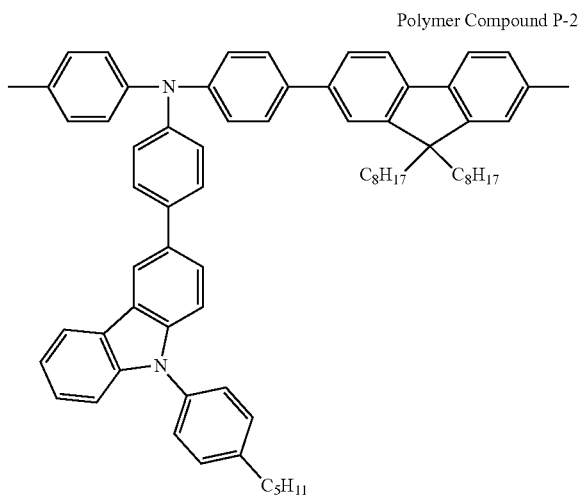

Polymer Compound P-2

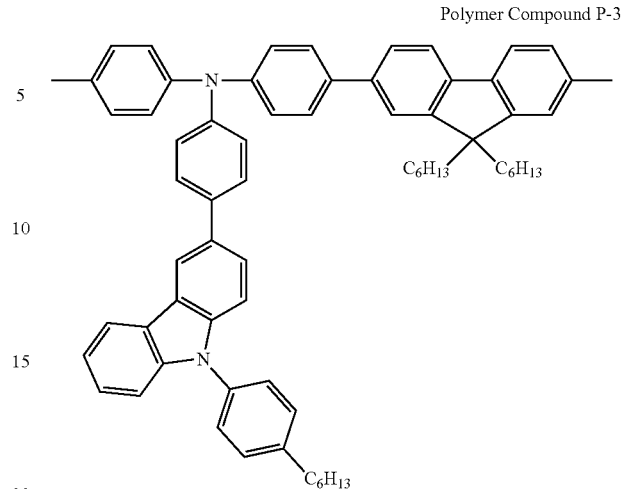

Polymer Compound P-3

Example 3

Under an argon atmosphere, Compound A-4 (1.64 g) according to Synthesis Example 3, 2,7-dibromo-9,9-dihexylfluorene (0.983 g), palladium acetate (9.0 mg), tris(2-methoxy phenyl)phosphine (42.2 mg), 53 mL of toluene, and a 20 mass % tetraethyl ammonium hydroxide aqueous solution (10.3 g) are added in a four-necked flask and then, stirred at 85° C. for 6 hours. Subsequently, 241 mg of phenylboronic acid, 140 mg of tetrakis(triphenylphosphine) palladium, and a 20 mass % tetraethylammonium hydroxide aqueous solution (10.3 g) are added thereto and then, stirred for 3 hours. Then, sodium N,N-diethyldithiocarbamate trihydrate (13.5 g) dissolved in 50 mL of ion exchange water is added thereto and then, stirred at 85° C. for 2 hours. An organic layer is separated from a water layer and then, washed with water, a 3 mass % acetic acid aqueous solution, and water. The organic layer is passed through a column charged with silica gel/alumina, and a solvent is distilled and removed therefrom under a reduced pressure. The obtained liquid is added to methanol in a dropwise fashion, and a solid precipitated therein is dissolved in toluene. Subsequently, this solution is added to methanol in a dropwise fashion, and a solid precipitated therein is filtered and dried to obtain Polymer Compound P-3 (1.35 g). A weight average molecular weight (Mw) and polydispersity (Mw/Mn) of Polymer Compound P-3 are measured with SEC. As a result, the weight average molecular weight (Mw) and polydispersity (Mw/Mn) of Polymer Compound P-3 are respectively 86,000 and 2.56.

Polymer Compound P-3 obtained in this way is estimated to be a polymer compound having the following structural units from a content ratio of the monomers.

Example 4

Under an argon atmosphere, Compound A-4 (1.72 g) according to Synthesis Example 3, 2,7-dibromo-9,9-dioctyl fluorene (1.15 g), palladium acetate (9.4 mg), tris(2-methoxy phenyl)phosphine (44.2 mg), 57 mL of toluene, and a 20 mass % tetraethylammonium hydroxide aqueous solution (10.7 g) are added in a four-necked flask and then, stirred at 85° C. for 6 hours. Subsequently, 121 mg of phenylboronic acid, 146 mg of tetrakis(triphenylphosphine)palladium, and a 20 mass % tetraethylammonium hydroxide aqueous solution (10.7 g) are added thereto and then, stirred for 3 hours. Then, sodium N,N-diethyldithiocarbamate trihydrate (14.1 g) dissolved in 50 mL of ion exchange water is added thereto and then, stirred at 85° C. for 2 hours. An organic layer is separated from a water layer and then, washed with water, a 3 mass % acetic acid aqueous solution, and water. The organic layer is passed through a column charged with silica gel/alumina, and a solvent is distilled and removed therefrom under a reduced pressure. The obtained liquid is added to methanol in a dropwise fashion, and a solid precipitated therein is dissolved in toluene. Subsequently, this solution is added to methanol in a dropwise fashion, and a solid precipitated therein is filtered and dried to obtain Polymer Compound P-4 (1.14 g). A weight average molecular weight (Mw) and polydispersity (Mw/Mn) of Polymer Compound P-4 are measured with SEC. As a result, the weight average molecular weight (Mw) and polydispersity (Mw/Mn) of Polymer Compound P-4 are respectively 139,000 and 3.39.

Polymer Compound P-4 obtained in this way is estimated to be a polymer compound having the following structural units from a content ratio of the monomers.

Polymer Compound P-4

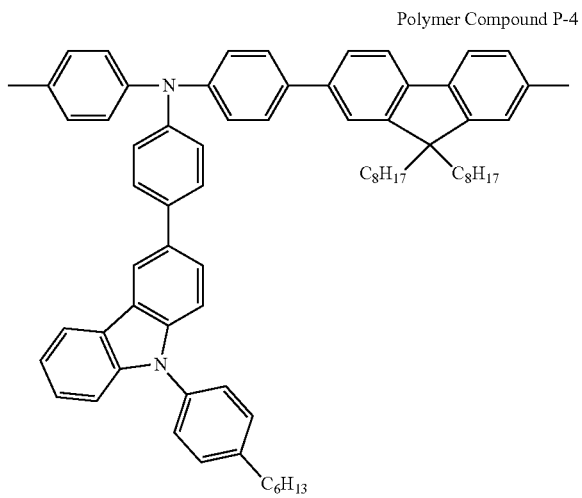

Polymer Compound P-5

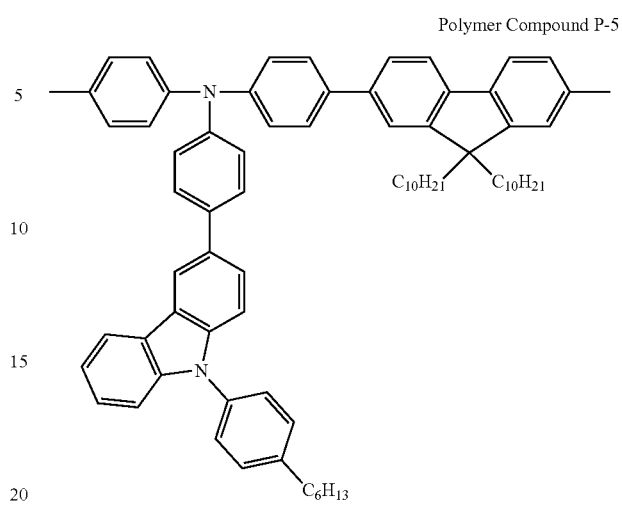

Example 5

Under an argon atmosphere, Compound A-4 (1.46 g) according to Synthesis Example 3, 2,7-dibromo-9,9-didecylfluorene (1.07 g), palladium acetate (8.0 mg), tris(2-methoxy phenyl)phosphine (37.5 mg), 51 mL of toluene, and a 20 mass % tetraethylammonium hydroxide aqueous solution (9.15 g) are added in a four-necked flask and then, stirred at 85° C. for 6 hours. Subsequently, 214 mg of phenylboronic acid, 124 mg of tetrakis(triphenylphosphine) palladium, and a 20 mass % tetraethylammonium hydroxide aqueous solution (9.15 g) are added thereto and then, stirred for 3 hours. Then, sodium N,N-diethyldithiocarbamate trihydrate (12.0 g) dissolved in 50 mL of ion exchange water is added thereto and then, stirred at 85° C. for 2 hours.

An organic layer is separated from a water layer and then, washed with water, a 3 mass % acetic acid aqueous solution, and water The organic layer is passed through a column charged with silica gel/alumina, and a solvent is distilled and removed therefrom under a reduced pressure.

The obtained liquid is added to methanol in a dropwise fashion, and a solid precipitated therein is dissolved in toluene. Subsequently, this solution is added to methanol in a dropwise fashion, and a solid precipitated therein is filtered and dried to obtain Polymer Compound P-5 (1.29 g). A weight average molecular weight (Mw) and polydispersity (Mw/Mn) of Polymer Compound P-5 are measured with SEC. As a result, the weight average molecular weight (Mw) and polydispersity (Mw/Mn) of Polymer Compound P-5 are respectively 101,000 and 2.66.

Polymer Compound P-5 obtained in this way is estimated to be a polymer compound having the following structural units from a content ratio of the monomers.

Example 6

Under an argon atmosphere, Compound A-4 (1.39 g) according to Synthesis Example 3, 2,7-dibromo-9,9-didodecylfluorene (1.11 g), palladium acetate (7.6 mg), tris(2-methoxy phenyl) phosphine (35.6 mg), 50 mL of toluene, and a 20 mass % tetraethyl ammonium hydroxide aqueous solution (8.67 g) are added in a four-necked flask and then, stirred at 85° C. for 6 hours. Subsequently, 121 mg of phenylboronic acid, 118 mg of tetrakis(triphenylphosphine) palladium, and a 20 mass % tetraethylammonium hydroxide aqueous solution (8.67 g) are added thereto and then, stirred for 3 hours. Then, sodium N,N-diethyldithiocarbamate trihydrate (11.4 g) dissolved in 50 mL of ion exchange water is added thereto and then, stirred at 85° C. for 2 hours. An organic layer is separated from a water layer and then, washed with water, a 3 mass % acetic acid aqueous solution, and water. The organic layer is passed through a column charged with silica gel/alumina, and a solvent is distilled and removed therefrom under a reduced pressure. The obtained liquid is added to methanol in a dropwise fashion, and a solid precipitated therein is dissolved in toluene. Subsequently, this solution is added to methanol in a dropwise fashion, and a solid precipitated therein is filtered and dried to obtain Polymer Compound P-6 (1.41 g). A weight average molecular weight (Mw) and polydispersity (Mw/Mn) of Polymer Compound P-6 are measured with SEC. As a result, the weight average molecular weight (Mw) and polydispersity (Mw/Mn) of Polymer Compound P-6 are respectively 108,000 and 2.70.

Polymer Compound P-6 obtained in this way is estimated to be a polymer compound having the following structural units from a content ratio of the monomers.

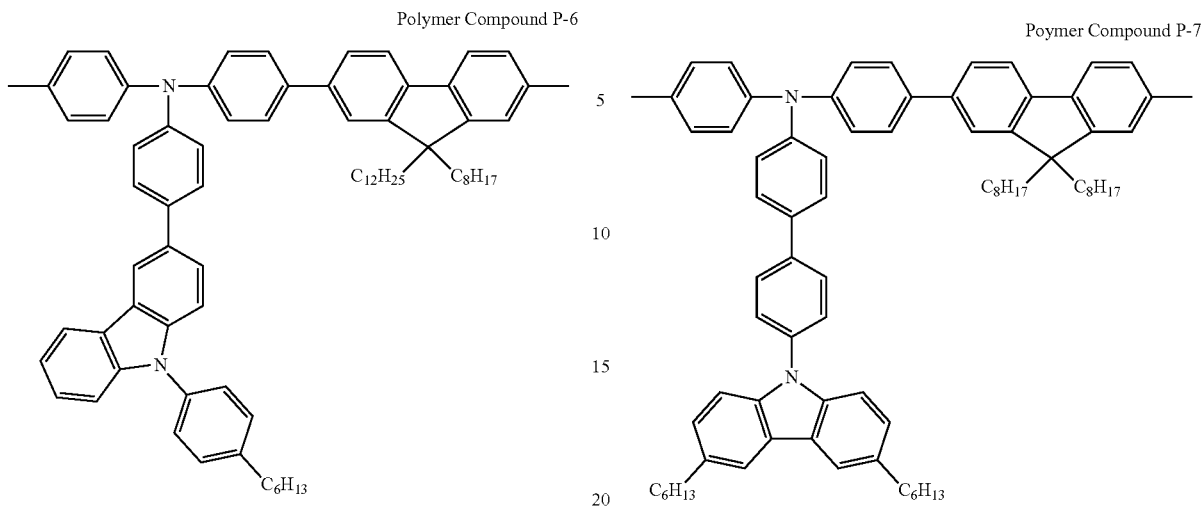

Polymer Compound P-6

Polymer Compound P-7

Example 7

Under an argon atmosphere, Compound B-4 (1.82 g) according to Synthesis Example 6, 2,7-bis(4,4,5,5-tetramethyl-1,3,2-dioxaborolane-2-)-9,9-di-n-octyl fluorene (1.10 g), palladium acetate (4.49 mg), tris(2-methoxyphenyl) phosphine (42.3 mg), toluene (58.5 mL), and a 20 mass % tetraethylammonium hydroxide aqueous solution (7.36 g) are added in a four-necked flask and then, stirred at 85° C. for 6 hours. Subsequently, phenylboronic acid (97.5 mg), tetrakis(triphenylphosphine)palladium (56.1 mg), and a 20 mass % tetraethylammonium hydroxide aqueous solution (7.36 g) are added thereto and then, stirred for 6 hours. Then, sodium N,N-diethyldithiocarbamate trihydrate (5.92 g) dissolved in 50 mL of ion exchange water is added thereto and then, stirred at 85° C. for 2 hours. An organic layer is separated from a water layer and then, washed with water, a 3 mass % acetic acid aqueous solution, and water. The organic layer is passed through a column charged with silica gel/alumina, and a solvent is distilled and removed therefrom under a reduced pressure. The obtained liquid is added to methanol in a dropwise fashion, and a solid precipitated therein is dissolved in toluene. Subsequently, this solution is added to methanol in a dropwise fashion, and a solid precipitated therein is filtered and dried to obtain Polymer Compound P-7 (0.51 g). A weight average molecular weight (Mw) and polydispersity (Mw/Mn) of Polymer Compound P-7 are measured with SEC. As a result, Mw and Mw/Mn of Polymer Compound P-7 are respectively 160,000 and 2.50.

Polymer Compound P-7 obtained in this way is estimated to be a polymer compound having the following structural units from a content ratio of the monomers.

Comparative Example 1

Under an argon atmosphere, Compound A-2 (1.43 g) according to Comparison Synthesis Example 1, 2,7-dibromo-9,9-didecylfluorene (1.17 g), palladium acetate (8.7 mg), tris(2-methoxy phenyl) phosphine (40.9 mg), 52 mL of toluene, and a 20 mass % tetraethylammonium hydroxide aqueous solution (9.98 g) are added in a four-necked flask and then, stirred at 85° C. for 6 hours. Subsequently, 234 mg of phenylboronic acid, 136 mg of tetrakis(triphenylphosphine)palladium, and a 20 mass % tetraethylammonium hydroxide aqueous solution (9.98 g) are added thereto and then, stirred for 3 hours. Then, sodium N,N-diethyldithiocarbamate trihydrate (13.1 g) dissolved in 50 mL of ion exchange water is added thereto and then, stirred at 85° C. for 2 hours. An organic layer is separated from a water layer and then, washed with water, a 3 mass % acetic acid aqueous solution, and water. The organic layer is passed through a column charged with silica gel/alumina, and a solvent is distilled and removed therefrom under a reduced pressure. The obtained liquid is added to methanol in a dropwise fashion, and a solid precipitated therein is dissolved in toluene. Subsequently, this solution is added to methanol in a dropwise fashion, and a solid precipitated therein is filtered and dried to obtain Polymer Compound P-8 (0.788 g). A weight average molecular weight (Mw) and polydispersity (Mw/Mn) of Polymer Compound P-8 are measured with SEC. As a result, the weight average molecular weight (Mw) and polydispersity (Mw/Mn) of Polymer Compound P-8 are respectively 209,000 and 1.90.

Polymer Compound P-8 obtained in this way is estimated to be a polymer compound having the following structural units from a content ratio of the monomers.

Polymer Compound P-8

Polymer Compound P-9

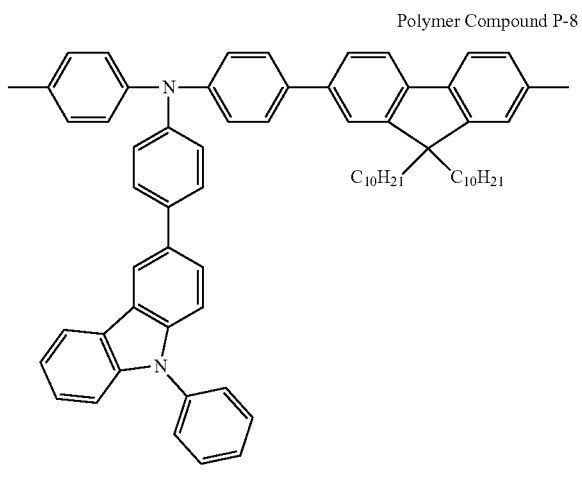

Comparative Example 2

Under an argon atmosphere, Compound A-2 (1.34 g) according to Comparison Synthesis Example 1, 2,7-dibromo-9,9-ditocecilfluorene (1.20 g), palladium acetate (8.2 mg), tris(2-methoxy phenyl)phosphine (38.6 mg), toluene 51 mL, and a 20 mass % tetraethylammonium hydroxide aqueous solution (9.41 g) are added in a four-necked flask and then, stirred at 85° C. for 6 hours. Subsequently, 221 mg of phenylboronic acid, 128 g of tetrakis(triphenylphosphine) palladium, and 941 g of a 20 mass % tetraethylammonium hydroxide aqueous solution are added thereto and then, stirred for 3 hours. Then, sodium N,N-diethyldithiocarbamate trihydrate (12.3 g) dissolved in 50 mL of ion exchange water is added thereto and then, stirred at 85° C. for 2 hours. An organic layer is separated from a water layer and then, washed with water, a 3 mass % acetic acid aqueous solution, and water. The organic layer is passed through a column charged with silica gel/alumina, and a solvent is distilled and removed therefrom under a reduced pressure. The obtained liquid is added to methanol in a dropwise fashion, and a solid precipitated therein is dissolved in toluene. Subsequently, this solution is added to methanol in a dropwise fashion, and a solid precipitated therein is filtered and dried to obtain Polymer Compound P-9 (0.788 g). A weight average molecular weight (Mw) and polydispersity (Mw/Mn) of Polymer Compound P-9 are measured with SEC. As a result, the weight average molecular weight (Mw) and polydispersity (Mw/Mn) of Polymer Compound P-9 are respectively 79,000 and 2.56.

Polymer Compound P-9 obtained in this way is estimated to be a polymer compound having the following structural units from a content ratio of the monomers.

Example 8

Under an argon atmosphere, Compound A-4 (1.54 g) according to Synthesis Example 3, 2,7-dibromo-9,9-(2-ethylhexyl)fluorene (1.03 g), palladium acetate (8.4 mg), tris(2-methoxy phenyl)phosphine (39.7 mg), 52 mL of toluene, and a 20 mass % tetraethylammonium hydroxide aqueous solution (9.69 g) are added in a four-necked flask and then, stirred at 85° C. for 6 hours. Subsequently, 227 mg of phenylboronic acid, 132 mg of tetrakis(triphenylphosphine) palladium, and a 20 mass % tetraethylammonium hydroxide aqueous solution (9.69 g) are added thereto and then, stirred for 3 hours. Then, sodium N,N-diethyldithiocarbamate trihydrate (12.7 g) dissolved in 50 mL of ion exchange water is added thereto and then, stirred at 85° C. for 2 hours. An organic layer is separated from a water layer and then, washed with water, a 3 mass % acetic acid aqueous solution, and water. The organic layer is passed through a column charged with silica gel/alumina, and a solvent is distilled and removed therefrom under a reduced pressure. The obtained liquid is added to methanol in a dropwise fashion, and a solid precipitated therein is dissolved in toluene. Subsequently, this solution is added to methanol in a dropwise fashion, and a solid precipitated therein is filtered and dried to obtain Polymer Compound P-10 (1.07 g). A weight average molecular weight (Mw) and polydispersity (Mw/Mn) of Polymer Compound P-10 are measured with SEC. As a result, the weight average molecular weight (Mw) and polydispersity (Mw/Mn) of Polymer Compound P-10 are respectively 108,000 and 2.74.

Polymer Compound P-10 obtained in this way is estimated to be a polymer compound having the following structural units from a content ratio of the monomers.

Polymer Compound P-10

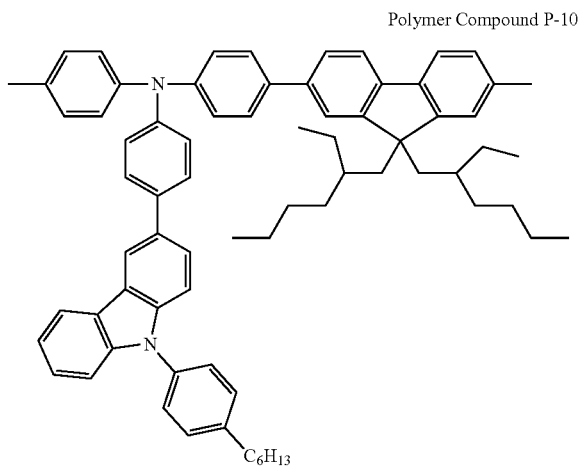

Polymer Compound P-11

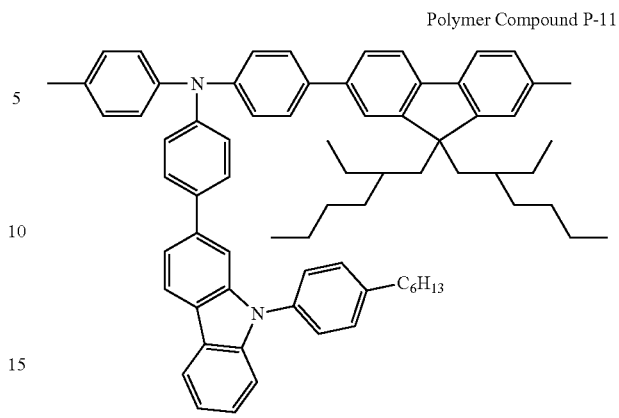

Example 9

Under an argon atmosphere, Compound A-5 (1.54 g) according to Synthesis Example 4, 2,7-dibromo-9,9-bis(2-ethylhexyl)fluorene (1.03 g), palladium acetate (4.2 mg), tris(2-methoxy phenyl) phosphine (39.7 mg), 52 mL of toluene, and a 20 mass % tetraethylammonium hydroxide aqueous solution (9.69 g) are added in a four-necked flask and then, stirred at 85° C. for 6 hours. Subsequently, 227 mg of phenylboronic acid, tetrakis(triphenylphosphine)palladium (79.2 mg), and a 20 mass % tetraethylammonium hydroxide aqueous solution (9.36 g) are added thereto and then, stirred for 3 hours. Then, sodium N,N-diethyldithiocarbamate trihydrate (6.35 g) dissolved in 50 mL of ion exchange water is added thereto and then, stirred at 85° C. for 2 hours. An organic layer is separated from a water layer and then, washed with water, a 3 mass % acetic acid aqueous solution, and water. The organic layer is passed through a column charged with silica gel/alumina, and a solvent is distilled and removed therefrom under a reduced pressure. The obtained liquid is added to methanol in a dropwise fashion, and a solid precipitated therein is dissolved in toluene. Subsequently, this solution is added to methanol in a dropwise fashion, and a solid precipitated therein is filtered and dried to obtain Polymer Compound P-11 (1.03 g). A weight average molecular weight (Mw) and polydispersity (Mw/Mn) of Polymer Compound P-11 are measured with SEC. As a result, the weight average molecular weight (Mw) and polydispersity (Mw/Mn) of Polymer Compound P-11 are respectively 45,900 and 2.19.

Polymer Compound P-11 obtained in this way is estimated to be a polymer compound having the following structural units from a content ratio of the monomers.

Example 10

As the first electrode (anode), a glass substrate with ITO in which indium tin oxide (ITO) is patterned with a film thickness of 150 nm is used. This glass substrate with ITO is washed in sequence using a neutral detergent, deionized water, water, and isopropyl alcohol, and then UV-ozone treatment is performed. Then, on this glass substrate with ITO, poly(3,4-ethylenedioxythiophene)/poly(4-styrenesulfonate) (PEDOT/PSS) (manufactured by Sigma-Aldrich) is coated by a spin coating method and then dried so that the dry film thickness is 30 nm. As a result, a hole injection layer having a thickness of 30 nm (dry film thickness) is formed on the glass substrate with ITO. On the hole injection layer, a toluene solution including 1.0 mass % of Polymer Compound P-1 (hole transport material) of Example 1 is coated by a spin coating method so that the dry film thickness may be 30 nm, and then heat-treated for 60 minutes at 230° C. to form a hole transport layer. Then, a hole transport layer having a thickness of 30 nm (dry film thickness) is formed on the hole injection layer.

In cyclohexane, blue quantum dots of ZnTeSe/ZnSe/ZnS (core/shell/shell: average diameter=about 10 nm) having the following structure are dispersed so as to be 1.0 mass %, to prepare quantum dot dispersion.

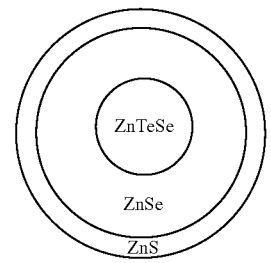

On the other hand, the hole transport layer (particularly Polymer Compound P-1) does not dissolve in cyclohexane. This quantum dot dispersion is coated on the hole transport layer by a spin coating method so that the dry film thickness may be 30 nm, and then dried. As a result, a quantum dot light-emitting layer having a thickness of 30 nm (dry film thickness) is formed on the hole transport layer. On the other hand, the light generated by irradiating the quantum dot dispersion with ultraviolet rays has a central wavelength of 462 nm and a half width of 30 nm.

The quantum dot light-emitting layer is completely dried. On this quantum dot light-emitting layer, using a vacuum evaporation apparatus, lithium quinolate (Liq) and 1,3,5-tris (N-phenylbenzimidazol-2-yl)benzene (TPBI) (Sigma-Aldrich) is co-deposited. As a result, an electron transport layer with a thickness of 36 nm is formed on the quantum dot light-emitting layer.

Using a vacuum evaporation apparatus, (8-quinolinolato) lithium (lithium quinolate) (Liq) is deposited on the electron transport layer. As a result, an electron injection layer with a thickness of 0.5 nm is formed on the electron transport layer.

Using a vacuum evaporation apparatus, aluminum (Al) is deposited on the electron injection layer. As a result, a second electrode (cathode) with a thickness of 100 nm is formed on the electron injection layer. Accordingly, quantum dot electroluminescence device 1 is obtained.

Example 11

A quantum dot electroluminescence device 2 is manufactured according to the same method as Example 10 except that Polymer Compound P-2 of Example 2 is used instead of Polymer Compound P-1.

Example 12

A quantum dot electroluminescence device 3 is manufactured according to the same method as Example 10 except that Polymer Compound P-3 of Example 3 is used instead of Polymer Compound P-1.

Example 13

A quantum dot electroluminescence device 4 is manufactured according to the same method as Example 10 except that Polymer Compound P-4 of Example 4 is used instead of Polymer Compound P-1.

Example 14

A quantum dot electroluminescence device 5 is manufactured according to the same method as Example 10 except that Polymer Compound P-5 of Example 5 is used instead of Polymer Compound P-1.

Example 15

A quantum dot electroluminescence device 6 is manufactured according to the same method as Example 10 except that Polymer Compound P-6 of Example 6 is used instead of Polymer Compound P-1.

Example 16

A quantum dot electroluminescence device 7 is manufactured according to the same method as Example 10 except that Polymer Compound P-7 of Example 7 is used instead of Polymer Compound P-1.

Example 17

A quantum dot electroluminescence device 8 is manufactured according to the same method as Example 10 except that Polymer Compound P-11 of Example 9 is used instead of Polymer Compound P-1.

Comparative Example 3

A comparative quantum dot electroluminescence device 1 is manufactured according to the same method as Example 10 except that poly[(9,9-dioctylfluorenyl-2,7-diyl)-co-(4,4'-(N-(4-sec-butylphenyl)diphenylamine)] (TFB) (Luminescence Technology Corp.) having the following structural unit is used instead of Polymer Compound P-1 in Example 10. A number average molecular weight (Mn) and polydispersity (Mw/Mn) of TFB are measured with SEC. As a result, a weight average molecular weight and Mw/Mn of TFB are 359,000 and 3.4 respectively. TFB:

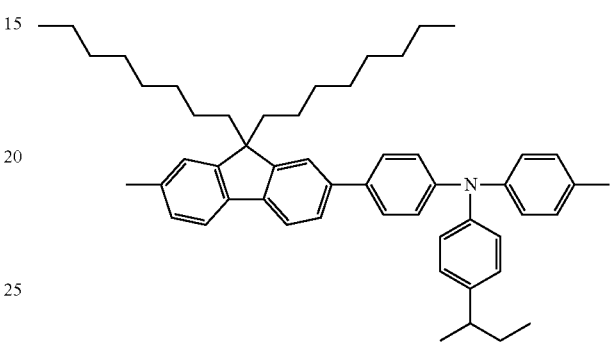

Comparative Example 4

A comparative quantum dot electroluminescence device 2 is manufactured according to the same method as Example 10 except that Polymer Compound P-8 of Comparative Example 1 is used instead of Polymer Compound P-1.

Comparative Example 5

A comparative quantum dot electroluminescence device 2 is manufactured according to the same method as Example 10 except that Polymer Compound P-9 of Comparative Example 2 is used instead of Polymer Compound P-1.

Evaluation 1 of Quantum Dot Electroluminescence Device

The quantum dot electroluminescence devices 1 to 8 according to Examples 10 to 17 and the comparative quantum dot electroluminescence devices 1 to 3 according to Comparative Examples 3 to 5 are evaluated with respect to luminous efficiency and luminescence life-span according to the following method. The results are shown in Table 1.

Luminous Efficiency

When a voltage is applied to each quantum dot electroluminescence device, and a current starts to flow therein at the constant voltage, the quantum dot electroluminescence device emits light. Herein, a DC constant voltage power supply (a source meter, Keyence Corp.) is used to measure the current of each device at every moment by slowly increasing the voltage, and a luminance-measuring device (SR-3, Topcom Technology Co., Ltd.) is used to measure luminance of the device at the time of emission. Herein, the measurement is terminated when the luminance begins to decline. An area of each device is used to calculate a current per unit area (current density), and then, current efficiency (cd/A) is calculated by dividing the luminance (cd/m²) by the current density (A/m²). In Table 1, the highest current efficiency within the measured voltage range is regarded to be cd/A max. On the other hand, the current efficiency represents efficiency of converting a current into light-emitting energy (conversion efficiency), and as the current efficiency is higher, a device exhibits the higher performance.

In addition, external quantum efficiency (EQE) (%) at cd/A max is calculated from a spectral radiant luminance spectrum measured by a luminance measuring device, assuming that Lambertian radiation is performed, and then, used to evaluate luminous efficiency.

In addition, when a voltage is applied to each quantum dot electroluminescence device using a direct current constant voltage power supply (a source meter made by Keyence Corp.), current starts to flow at a constant voltage, and the quantum dot electroluminescence device emits light. While measuring the light emission of each device using a luminance measuring device (SR-3 manufactured by Topcom Technology Co., Ltd.), the current is gradually increased, and the current is kept constant at the point where the luminance becomes 1000 nit (cd/m$^2$), and then the devices are left to stand. Herein, the voltage at 1000 nit is set to "V©1000 nit."

Luminescence Life-Span

A DC constant voltage power source (a source meter made by Keyence Corp.) is used to apply a predetermined voltage to each quantum dot electroluminescence device and thus make it emit light. The voltage is slowly increased, while luminance of the quantum dot electroluminescence device is measured by using a luminance-measuring device (SR-3, Topcom Technology Co., Ld.), and when the luminance becomes 650 nit (cd/m$^2$), the quantum dot electroluminescence device is allowed to stand while the current is kept constant. Time taken until the luminance measured by using the luminance-measuring device slowly decreases and reaches 50% of the initial luminance is regarded to be LT50 (hr).

TABLE 1

| | Polymer compound | cd/A max | V@1000 nit | EQE [%] | LT50 [hr] |
|---|---|---|---|---|---|
| Example 10 | P-1 | 1.9 | 3.0 | 2.7 | 42.6 |
| Example 11 | P-2 | 2.1 | 3.4 | 3.0 | 30.9 |
| Example 12 | P-3 | 2.5 | 3.2 | 4.0 | 51.2 |
| Example 13 | P-4 | 5.2 | 2.8 | 3.6 | 64.7 |
| Example 14 | P-5 | 1.9 | 3.9 | 2.9 | 36.3 |
| Example 15 | P-6 | 1.8 | 3.3 | 2.3 | 32.3 |
| Example 16 | P-7 | 6.8 | 3.1 | 10.6 | 30.3 |
| Example 17 | P-11 | 14.0 | 3.0 | 11.9 | 35.8 |
| Comparative Example 3 | TFB | 3.0 | 3.7 | 5.0 | 22.2 |
| Comparative Example 4 | P-8 | 1.6 | 3.7 | 2.7 | 28.9 |
| Comparative Example 5 | P-9 | 1.3 | 3.8 | 2.6 | 27.4 |

Referring to the results of Table 1, the quantum dot electroluminescence devices 1 to 8 of the examples exhibit greatly high durability (greatly long luminescence life-span), compared with the comparative quantum dot electroluminescence devices 2 to 3 using no arylamine-fluorene alternating copolymer according to the present disclosure. In addition, the quantum dot electroluminescence devices 1 to 8 of the examples exhibit higher luminous efficiency at an equal or lower driving voltage, compared with the comparative quantum dot electroluminescence devices 2 to 3 using no arylamine-fluorene alternating copolymer according to the present disclosure. On the other hand, luminous efficiency (EQE) of the comparative quantum dot electroluminescence device 1 is higher than that of the quantum dot electroluminescence devices 1 to 8 of the examples but greatly deteriorated at a luminescence life-span (LT50). Accordingly, overall, the comparative quantum dot electroluminescence device 1 is deteriorated in terms of luminance performance (balance between luminous efficiency and luminescence life-span) in actual use, compared with the quantum dot electroluminescence devices 1 to 8 of the examples. On the other hand, in this embodiment, blue quantum dot electroluminescence devices are evaluated, but the same results may be obtained for red quantum dot electroluminescence devices and the like.

Example 18

As the first electrode (anode), a glass substrate with ITO in which indium tin oxide (ITO) is patterned with a film thickness of 150 nm is used. This glass substrate with ITO is washed in sequence using a neutral detergent, deionized water, and isopropyl alcohol, and then UV-ozone treatment is performed. Then, on this glass substrate with ITO, poly (3,4-ethylenedioxythiophene)/poly(4-styrenesulfonate) (PEDOT/PSS) (manufactured by Sigma-Aldrich Co., Ltd.) is coated by a spin coating method and then dried so that the dry film thickness may be 30 nm. As a result, a hole injection layer having a thickness of 30 nm (dry film thickness) is formed on the glass substrate with ITO. On the hole injection layer, a toluene solution including 1.0 mass % of Polymer Compound P-3 (hole transport material) of Example 3 is coated by a spin coating method so that the dry film thickness may be 30 nm, and then heat-treated for 60 minutes at 230° C. to form a hole transport layer. Then, a hole transport layer having a thickness of 30 nm (dry film thickness) is formed on the hole injection layer.

In cyclohexane, a red quantum dot of InP/ZnSe/ZnS (core/shell/shell: average diameter=about 10 nm) having the following structure is dispersed so as to be 1.0 mass % to prepare quantum dot dispersion.

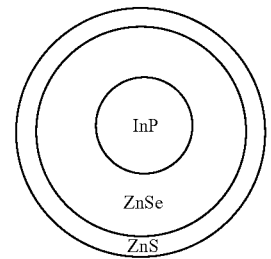

On the other hand, the hole transport layer (particularly Polymer Compound P-3) does not dissolve in cyclohexane. This quantum dot dispersion is coated on the hole transport layer by a spin coating method so that the dry film thickness may be 30 nm, and then dried. As a result, a quantum dot light-emitting layer having a thickness of 30 nm (dry film thickness) is formed on the hole transport layer. On the other hand, the light generated by irradiating the quantum dot dispersion with ultraviolet (UV) light has a central wavelength of 627 nm and a half width of 35 nm.

The quantum dot light-emitting layer is completely dried. On this quantum dot light-emitting layer, using a vacuum evaporation apparatus, lithium quinolate (Liq) and 1,3,5-tris (N-phenyl benzimidazole-2-yl)benzene (TPBI) as an electron transport material (manufactured by Sigma-Aldrich Co., Ltd.) is deposited. As a result, an electron transport layer having a thickness of 36 nm is formed on the quantum dot light-emitting layer.

Using a vacuum evaporation apparatus, (8-quinolinolato) lithium (lithium quinolate) (Liq) is deposited on the electron transport layer. As a result, an electron injection layer having a thickness of 0.5 nm is formed on the electron transport layer.

Using a vacuum evaporation apparatus, aluminum (Al) is deposited on the electron injection layer. As a result, a second electrode (cathode) with a thickness of 100 nm is formed on the electron injection layer. Accordingly, quantum dot electroluminescence device 9 is obtained.

Example 19

A quantum dot electroluminescence device 10 is manufactured according to the same method as Example 18 except that Polymer Compound P-4 of Example 4 is used instead of Polymer Compound P-3.

Example 20

A quantum dot electroluminescence device 11 is manufactured according to the same method as Example 18 except that Polymer Compound P-10 of Example 8 is used instead of Polymer Compound P-3.

Example 21

A quantum dot electroluminescence device 12 is manufactured according to the same method as Example 18 except that Polymer Compound P-7 of Example 7 is used instead of Polymer Compound P-3.

Example 22

A quantum dot electroluminescence device 13 is manufactured according to the same method as Example 18 except that Polymer Compound P-11 of Example 9 is used instead of Polymer Compound P-3.

Comparative Example 6

A comparative quantum dot electroluminescence device 4 is manufactured according to the same method as Example 16 except that poly[(9,9-dioctylfluorenyl-2,7-diyl)-co-(4,4'-(N-(4-sec-butylphenyl)diphenylamine)] (TFB) (Luminescence Technology Corp.) having the following structural unit is used instead of Polymer Compound P-3 in Example 18. A weight average molecular weight (Mw) and polydispersity (Mw/Mn) of TFB are measured with SEC. As a result, a weight average molecular weight and Mw/Mn of TFB are 359,000 and 3.4 respectively. TFB:

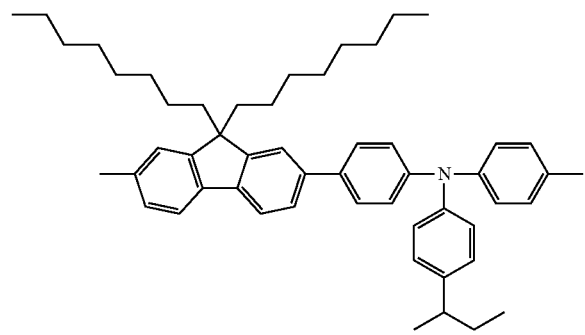

Evaluation 2 of Quantum Dot Electroluminescence Device

The quantum dot electroluminescence devices 9 to 13 manufactured in Examples 18 to 22 and comparative quantum dot electroluminescence device 4 manufactured in Comparative Example 65 are evaluated with respect to luminous efficiency and luminescence life-span according to the following method. The results are shown in Table 2.

Luminous Efficiency

When a voltage is applied to each quantum dot electroluminescence device, and a current starts to flow therein at a constant voltage, the quantum dot electroluminescence device emits light. A DC constant voltage power supply (a source meter made by Keyence Corp.) is used to slowly increase a voltage of each device, and a luminance-measuring device (SR-3, Topcom Technology Co., Ltd.) is used to measure a current at that time and thus obtain luminance of the device when emitting light. Herein, when the luminance starts to decline, the measurement is finished. An area of each device is used to calculate a current per unit area (current density), and the luminance ($cd/m^2$) is divided by the current density ($A/m^2$) to obtain current efficiency (cd/A). In Table 2, the highest current efficiency within the measured voltage range is regarded as cd/A max. On the other hand, the current efficiency represents efficiency of converting the current into light-emitting energy (conversion efficiency), and herein, as the current efficiency is higher, the device exhibits higher performance.

In addition, external quantum efficiency (EQE) (%) at cd/A max is calculated from a spectral radiant luminance spectrum measured by a luminance measuring device, assuming that Lambertian radiation is performed, and then, used to evaluate luminous efficiency.

In addition, when a voltage is applied to each quantum dot electroluminescence device using a direct current constant voltage power supply (made by KEYENCE, a source meter), current starts to flow at a constant voltage, and the quantum dot electroluminescence device emits light. While measuring the light emission of each device using a luminance measuring device (manufactured by Topcom, SR-3), the current is gradually increased, and the current is kept constant at the point where the luminance becomes 1000 nit ($cd/m^2$), and then the devices are left to stand. Herein, the voltage at 1000 nit is set to "V@1000 nit."

Luminescence Life-Span

A DC constant voltage power supply (a source meter made by Keyence Corp.) is used to apply a predetermined voltage to each quantum dot electroluminescence device and thus make the quantum dot electroluminescence device emit light. A luminance-measuring device (SR-3, Topcom Technology Co., Ltd.) is used to measure luminance of the quantum dot electroluminescence, and when the luminance reaches 4500 nit ($cd/m^2$) by slowly increasing a current, the device is allowed to stand, while the current is kept constant. Time taken until the luminance measured by the luminance-measuring device slowly decreases and become 80% of the initial luminance is regarded as LT80 (hr).

TABLE 2

| | Polymer compound | cd/A max | V@1000 nit | EQE [%] | LT80 [hr] |
|---|---|---|---|---|---|
| Example 18 | P-3 | 22.9 | 2.3 | 19.7 | 145 |
| Example 19 | P-4 | 15.0 | 1.5 | 13.2 | 104 |
| Example 20 | P-10 | 15.4 | 2.3 | 13.3 | 210 |
| Example 21 | P-7 | 20.9 | 3.0 | 19.1 | 40 |
| Example 22 | P-11 | 14.5 | 2.5 | 12.0 | 179 |
| Comparative Example 6 | TFB | 18.0 | 2.7 | 16.0 | 20 |

Referring to the results of Table 2, the quantum dot electroluminescence devices 9 to 13 of the examples exhibit greatly high durability (greatly long luminescence lifespan), compared with the comparative quantum dot electroluminescence device 4. In addition, the quantum dot electroluminescence devices 9 to 13 according to the examples exhibit almost equal luminous efficiency at a lower driving voltage, compared with that of the comparative quantum dot electroluminescence device 4. On the other hand, in the present example, evaluation is made on a red quantum dot electroluminescence device, but it is considered that the same results as described above will be also obtained in a blue quantum dot electroluminescence device and the like.

Characteristic Evaluation of Each Polymer Compound

For Polymer Compounds P-1 to P-7 and P-10 of Examples 1 to 7 and 15, HOMO trap (eV), LUMO trap (eV), and glass transition temperature (Tg) (° C.) are measured. The results are shown in Table 3.

Measurement of HOMO Trap

Each polymer compound is dissolved in xylene so that its concentration becomes 1 mass % to prepare a coating solution. On a UV-cleaned ITO-attached glass substrate, using the coating solution prepared above, a film is formed by spin coating at a rotational speed of 2000 rpm, dried on a hot plate at 150° C. for 30 minutes, manufacturing measuring samples. A photoelectron spectroscope (AC-3, Riken Keiki Co., Ltd.) is used to measure a HOMO trap of each sample in the air atmosphere. Herein, the measurement results are used to calculate a rising tangential intersection, which is regarded as the HOMO trap (eV). On the other hand, the HOMO trap is usually negative.

Measurement of LUMO Trap

Each polymer compound is dissolved in xylene so that its concentration becomes 3.2 mass % to prepare a coating solution. On a UV-cleaned and ITO-attached glass substrate, the prepared coating solution is spin-coated at 1600 rpm, dried at 250° C. for 60 minutes on a hot plate to form a sample (a film thickness: about 70 nm) for measurement. The sample is cooled down to 77K (−196° C.), and a photo luminance (PL) spectrum thereof is measured. A peak value of the shortest wavelength side of the PL spectrum is used to calculate a LUMO trap (eV).

Glass Transition Temperature (Tg)

A glass transition temperature (Tg) of each polymer compound is measured by using differential scanning calorimetry (DSC) (DSC6000, Seiko Instrument Inc.) and specifically, heating the samples up to 300° C. at 10° C./min, holding them for 10 minutes, cooling them down to 25° C. at 10° C./min, and holding them for 10 minutes, and heating again them up to 300° C. at 10° C./min. When the measurement is complete, the samples are cooled down to room temperature (25° C.) at 10° C./min.

TABLE 3

| | Polymer compound | Structural unit | Mw (Mw/Mn) | HOMO (eV) | LUMO (eV) | Tg (° C.) |
|---|---|---|---|---|---|---|
| Example 1 | P-1 | 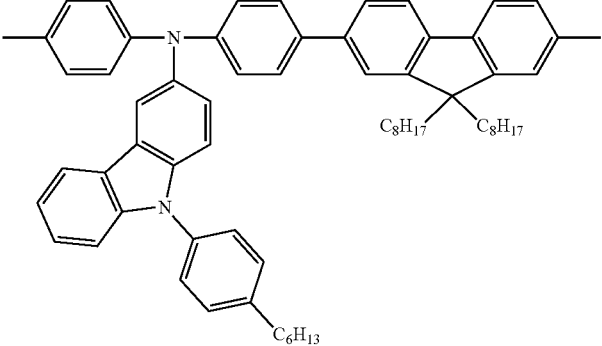 | 240,000 (5.20) | 5.33 | 2.50 | 146 |
| Example 2 | P-2 | 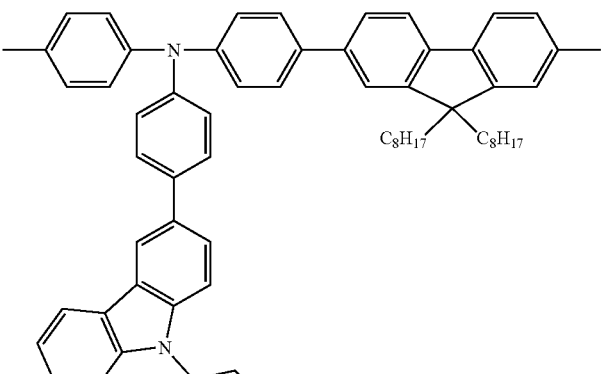 | 91,600 (2.50) | 5.44 | 2.57 | 147 |

TABLE 3-continued

| | Polymer compound | Structural unit | Mw (Mw/Mn) | HOMO (eV) | LUMO (eV) | Tg (° C.) |
|---|---|---|---|---|---|---|
| Example 3 | P-3 | (structure) | 86,000 (2.56) | 5.47 | 2.63 | 162 |
| Example 4 | P-4 | (structure) | 139,000 (3.39) | 5.45 | 2.60 | 150 |
| Example 5 | P-5 | (structure) | 101,000 (2.66) | 5.44 | 2.61 | 129 |

TABLE 3-continued

| Polymer compound | | Structural unit | Mw (Mw/Mn) | HOMO (eV) | LUMO (eV) | Tg (° C.) |
|---|---|---|---|---|---|---|
| Example 6 | P-6 | (structure) | 108,000 (2.70) | 5.44 | 2.62 | 110 |
| Example 7 | P-7 | (structure) | 160,000 (2.50) | 5.73 | 2.85 | 151.9 |
| Example 8 | P-10 | (structure) | 108,000 (2.74) | 5.49 | 2.63 | 162 |

TABLE 3-continued

| Polymer compound | Structural unit | Mw (Mw/Mn) | HOMO (eV) | LUMO (eV) | Tg (° C.) |
|---|---|---|---|---|---|
| Example 9 P-11 | 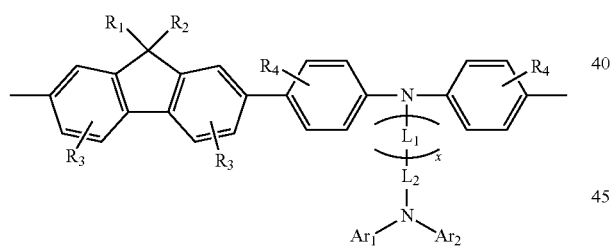 | 45,000 (2.19) | 5.57 | 2.57 | 156 |

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. An arylamine-fluorene alternating copolymer comprising a structural unit (A) represented by Chemical Formula (1):

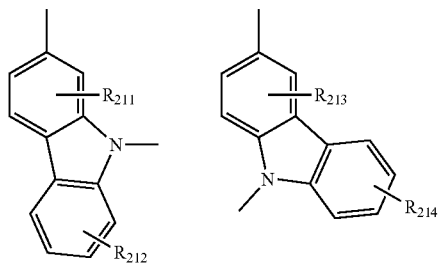

(1)

wherein, in Chemical Formula (1), each occurrence of $R_1$ to $R_4$ independently represents a hydrogen atom or a hydrocarbon group having 1 to 16 carbon atoms, $L_1$ represents a substituted or unsubstituted aromatic hydrocarbon group having 6 to 25 carbon atoms or a substituted or unsubstituted divalent aromatic heterocyclic group, x is 0, 1, or 2 and when x is 2, each occurrence of $L_1$ may be the same or different, respectively, $L_2$ represents a substituted or unsubstituted aromatic hydrocarbon group having 6 to 25 carbon atoms or a substituted or unsubstituted divalent aromatic heterocyclic group, wherein $L_2$ may form a ring with $Ar_1$, $Ar_1$ represents a substituted or unsubstituted aromatic hydrocarbon group having 6 to 25 carbon atoms, or a substituted or unsubstituted divalent aromatic heterocyclic group, and forms a ring with $L_2$, and $Ar_2$ represents an aromatic hydrocarbon group or an aromatic heterocyclic group having 6 to 25 carbon atoms wherein the aromatic hydrocarbon group or the aromatic heterocyclic group is substituted with a linear hydrocarbon group having 1 to 12 carbon atoms or a branched hydrocarbon group having 1 to 12 carbon atoms.

2. The arylamine-fluorene alternating copolymer of claim 1, wherein the ring formed by $L_2$ and $Ar_1$ in Chemical Formula (1) is one of the following groups:

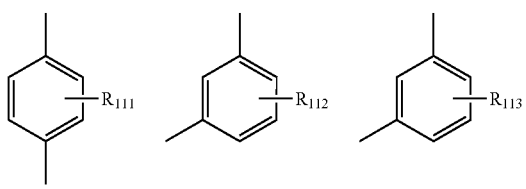

wherein, in the above chemical formulas, $R_{211}$ to $R_{214}$ each independently represent a hydrogen atom, or a linear alkyl group having 3 to 10 carbon atoms or a branched alkyl group having 3 to 10 carbon atoms.

3. The arylamine-fluorene alternating copolymer of claim 1, wherein the structural unit (A) is included in a ratio of greater than or equal to about 10 mol % and less than or equal to about 100 mol % based on the total structural units.

4. The arylamine-fluorene alternating copolymer of claim 1, wherein in Chemical Formula (1), x is 1 or 2, and $L_1$ is one of the following divalent groups:

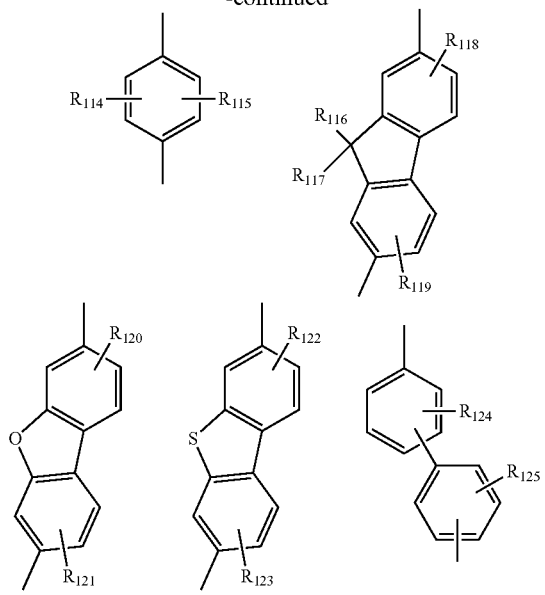

wherein, in the above chemical formulas, $R_{111}$ to $R_{125}$ each independently represent a hydrogen atom or a linear hydrocarbon group having 1 to 16 carbon atoms or a branched hydrocarbon group having 1 to 16 carbon atoms.

5. The arylamine-fluorene alternating copolymer of claim 1, wherein the structural unit (A) is one of the following groups:

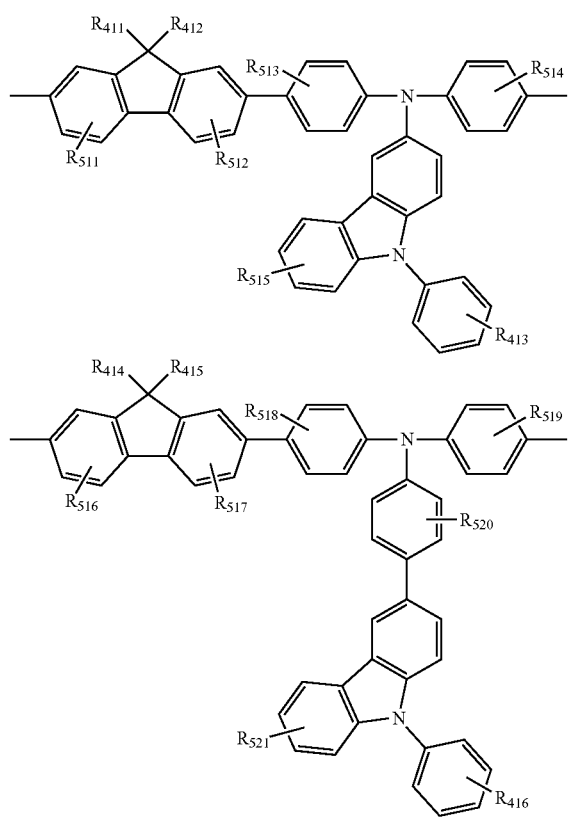

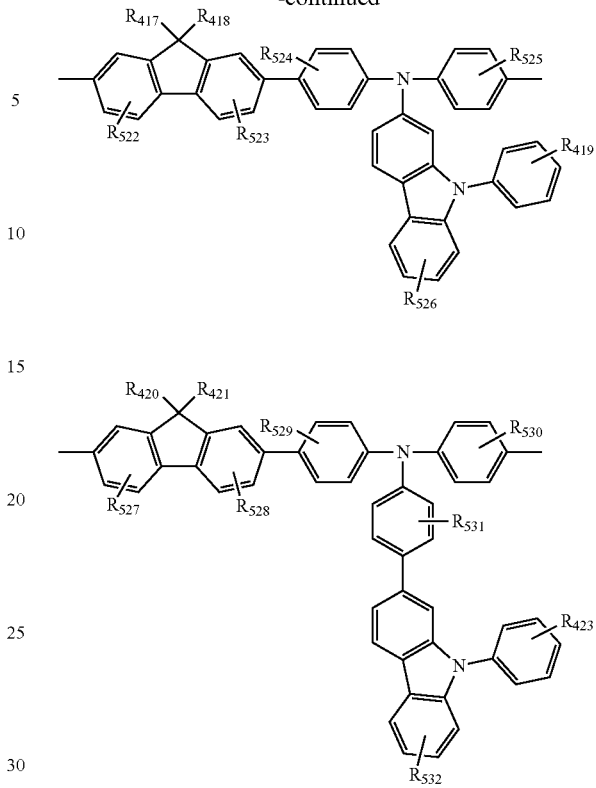

wherein, in the above chemical formula, $R_{411}$ to $R_{423}$ each independently represent a linear alkyl group having 1 to 12 carbon atoms or a branched alkyl group having 1 to 12 carbon atoms, and $R_{511}$ to $R_{532}$ each independently represent a hydrogen atom or a hydrocarbon group having 1 to 16 carbon atoms.

6. An electroluminescence device material comprising the arylamine-fluorene alternating copolymer of claim 1.

7. An electroluminescence device, comprising a first electrode, a second electrode, and at least one organic film disposed between the first electrode and the second electrode, wherein at least one layer of the organic film comprises the arylamine-fluorene alternating copolymer of claim 1.

8. The electroluminescence device of claim 7, wherein the organic film comprising the arylamine-fluorene alternating copolymer is a hole transport layer or a hole injection layer.

9. The electroluminescence device of claim 7, wherein the organic film comprises a light-emitting layer comprising a semiconductor nanoparticle or an organic metal complex.

* * * * *